(12) United States Patent
Williams

(10) Patent No.: US 8,593,220 B2
(45) Date of Patent: Nov. 26, 2013

(54) POWER MOSFETS WITH IMPROVED EFFICIENCY FOR MULTI-CHANNEL CLASS D AUDIO AMPLIFIERS AND PACKAGING THEREFOR

(71) Applicant: Advanced Analogic Technologies Incorporated, Santa Clara, CA (US)

(72) Inventor: Richard K. Williams, Cupertino, CA (US)

(73) Assignee: Advanced Analogic Technologies Incorporated, Santa Clara, CA (US)

( * ) Notice: Subject to any disclaimer, the term of this patent is extended or adjusted under 35 U.S.C. 154(b) by 0 days.

(21) Appl. No.: 13/788,336

(22) Filed: Mar. 7, 2013

(65) Prior Publication Data

US 2013/0200952 A1      Aug. 8, 2013

Related U.S. Application Data

(63) Continuation of application No. 11/874,182, filed on Oct. 17, 2007, now Pat. No. 8,427,235.

(60) Provisional application No. 60/911,694, filed on Apr. 13, 2007.

(51) Int. Cl.
    *H03F 3/217*     (2006.01)

(52) U.S. Cl.
    USPC ........................ 330/251; 330/207 A

(58) Field of Classification Search
    USPC ........................ 330/251, 10, 207 A
    See application file for complete search history.

(56) References Cited

U.S. PATENT DOCUMENTS

| | | | | |
|---|---|---|---|---|
| 5,617,058 | A | * | 4/1997 | Adrian et al. .................. 330/10 |
| 7,307,474 | B2 | * | 12/2007 | Nguyen .................. 330/207 A |
| 7,408,313 | B1 | * | 8/2008 | Kong et al. .................. 318/293 |

* cited by examiner

*Primary Examiner* — Henry Choe
(74) *Attorney, Agent, or Firm* — Lando & Anastasi, LLP

(57) ABSTRACT

A stereo class-D audio system includes a first die including four monolithically integrated NMOS high-side devices and a second a second die including four monolithically integrated PMOS low-side devices. The audio system also includes a set of electrical contacts for connecting the high and low-side devices to components within the a stereo class-D audio system, the set of electrical contacts including at least one supply contact for connecting the drains of the high-side devices to a supply voltage (Vcc) and at least one ground contact for connecting the drains of the low-side devices to ground, the electrical contacts also including respective contacts for each source of the high and low-side devices allowing the source of each high-side device to be connected to the source of a respective low-side device to form two H-bridge circuits.

21 Claims, 27 Drawing Sheets

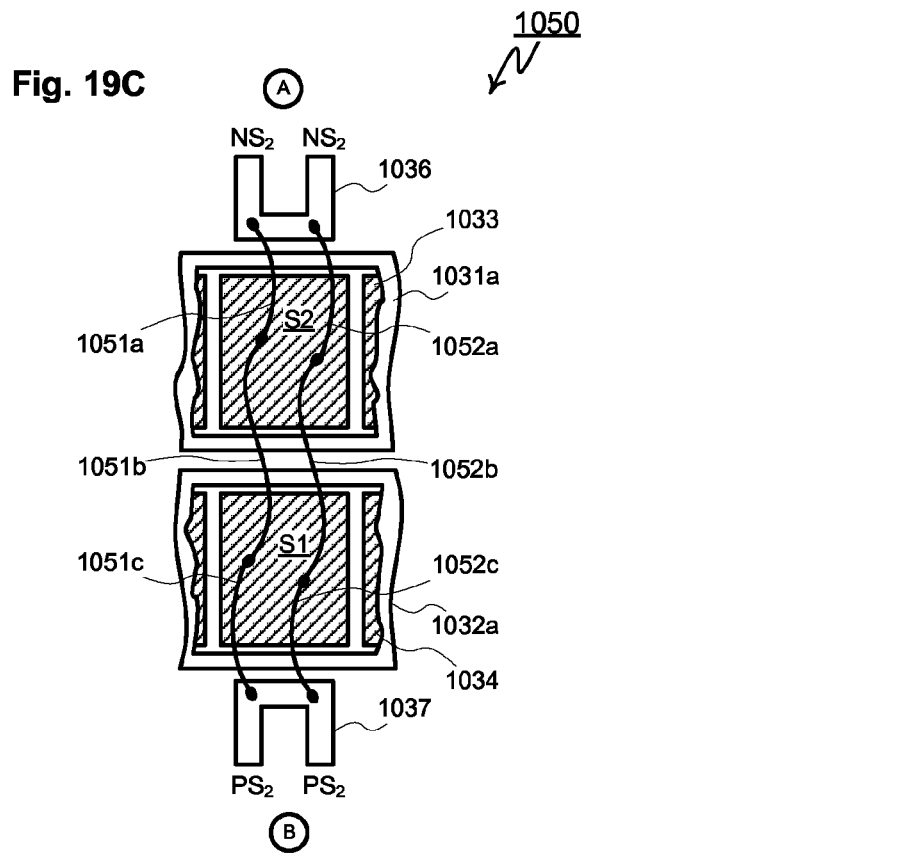
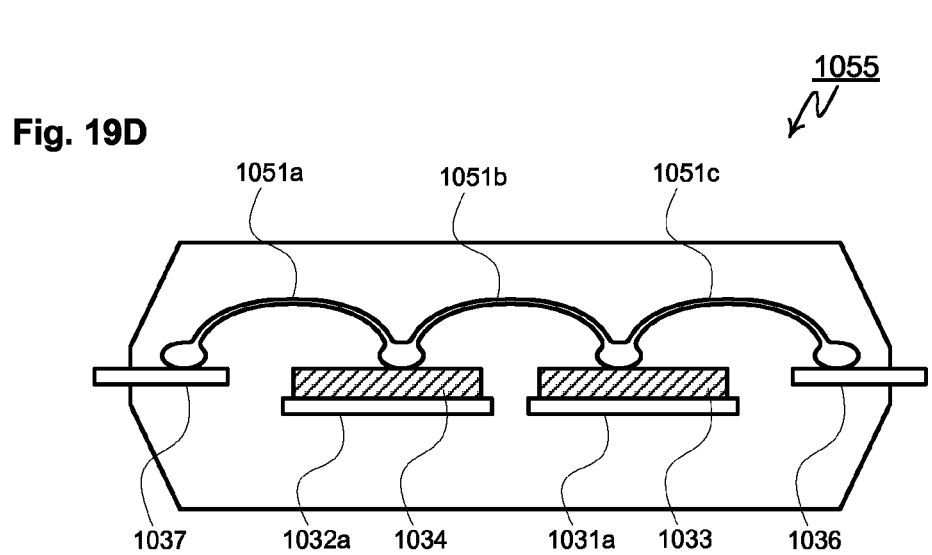

POWER MOSFETS WITH IMPROVED EFFICIENCY FOR MULTI-CHANNEL CLASS D AUDIO AMPLIFIERS AND PACKAGING THEREFOR

CROSS-REFERENCE TO RELATED APPLICATION

The application is a continuation of application Ser. No. 11/874,182, filed Oct. 17, 2007, now U.S. Pat. No. 8,427,235, issued Apr. 23, 2013, which is incorporated herein by reference in its entirety.

BACKGROUND OF THE INVENTION

High fidelity audio amplification using linear amplification suffers from poor efficiency, excess heating and reduced reliability of power electronic components, and the need for heavy and bulky heat sinking. In portable applications, poor efficiency also leads to shorter and generally unacceptable battery life.

High fidelity linear amplification using class-A amplifiers offers the least distortion but requires its power transistors to continuously carry current and dissipate power. Class B amplifiers introduces a dead-band in the circuit operation where neither transistor conducts but at the expense of increased distortion. Class-AB amplifiers attempt a compromise, but still sacrifice audio quality for efficiency and current consumption.

With the advent of power MOSFETs, a new type of audio amplification with higher efficiency became possible using class-D amplification methods. Class-D amplifiers operate by driving the speaker digitally using a push-pull power output stage or H bridge comprising continuously switched power MOSFETs. By driving a speaker on and off digitally at high frequencies, generally above the audible range, and through control of the pull-up and pull-down times using pulse width modulation (PWM) techniques, the speaker can be made only to respond to the audio content encoded in the PWM modulation.

The switching noise is naturally filtered by the inertial mass of the speaker's voice coil, unable to react to higher frequencies. Further filtering can also be performed digitally in the signal processing and decoding scheme, and additionally through a passive LC network as needed. Additional digital signal processing requires increased computing and more power consumption in digital circuitry. This extra power loss in part offsets the benefits of increased power efficiency of class D audio power amplification, especially at lower output power levels. Ignoring signal processing related power consumption, the power efficiency of a class D power amplifier relies on using low-resistance power MOSFETs, typically four per speaker, i.e. for each "channel". Cost, on the other hand, depends on using the smallest power MOSFETs implemented in the lowest cost process to minimize the cost per MOSFET switch. For a given MOSFET, a smaller area decreases cost at the expense of increased on-resistance. Larger die have lower on-resistance and improved power efficiency, but higher cost. This area and cost versus power efficiency tradeoff for any power MOSFET is expressed as the product of on-resistance $R_{DS(on)}$ and the die area A, so that a MOSFET constructed with a given technology and specific-on-resistance $R_{DS}A$ and of a given size $A_1$ will have an on-resistance $R_1$ given by $$R_1 = \frac{R_{DS}A}{A_1}$$

The power output stage may comprise monolithically integrated power MOSFETs or separately-packaged discrete power MOSFETs. Monolithic solutions are desirable for integrating drive electronic circuitry with the power devices themselves, but require much larger die sizes because the on-resistance of lateral devices are typically much higher than vertical discrete devices, especially for devices with blocking voltages over 12 volts. This is because the area efficiency of lateral devices is at best, no better than half that of vertical devices since a lateral device devotes valuable silicon real estate to both drain and source contacts. In contrast, a vertical power MOSFET uses almost the entire top-side as its source connection and 100% of its backside as its drain connection. The $R_{DS}A$ area efficiency and specific on-resistance of vertical devices can be one-fifth and even one-tenth that of a comparable breakdown lateral device.

Trench & Planar Vertical DMOS:

One such vertical prior art device, an N-channel vertical trench-gate DMOS power MOSFET 1 is illustrated in FIG. 1A. The device comprises an array of active gates embedded in trenches 4 etched into the silicon where the trenches are lined with a thin gate oxide 9 and then filled with conductive polysilicon 10 to form the gate electrode of the MOSFET device. The trench gates 4 are formed in an epitaxially deposited layer 3, shown as N conductivity type material grown atop an N+ heavily doped substrate 2. The trench gates are contacted by a special gate 14 where the polysilicon 15 exits the trench and is contacted by metal 16, separately from source connected metal 13.

Between adjacent trench gates, P-type body regions PB are implanted and optionally diffused to form the body or channel region 5 of the MOSFET. Heavily doped P+ region 6 is used to make Ohmic contact to P-body region 5. Inside said PB body regions, source regions 7 are masked and implanted abutting, the trench gates 4, forming the N-channel MOSFETs heavily-doped source regions. The device is called DMOS because the device has two junctions one inside the other, i.e. where body 5 is formed and contained within drain epitaxy 3 and source 7 is formed and contained with body 5, hence the acronym D for "double". The term DMOS originally stood for a MOSFET with a double diffused source-channel, but new fabrication methods have emerged for forming the double junctions with minimal or no high temperature diffusions.

Top source metal 13, typically comprising aluminum, aluminum silicon, or aluminum-copper-silicon is used to contact both N+ source regions 7 and P+ regions 6, and short them together. Aside from top metal 13, a barrier metal, typically a refractory metal such as titanium, platinum or tungsten is preferably employed to prevent metal alloying from spiking through the junction and shorting out the device. Conduction is vertical, with a positive potential applied via metal 16 onto poly gates 15 and 10, an N type inversion layer is induced in PB body regions 5 along the side of trenches 4, allowing current to flow from positively biased N+ drain 2, through epitaxial layer 3, into said channel, through N+ region, and out grounded source metal 13. Ohmic contact is made to the backside of N+ substrate 2 using gold or titanium-nickel-silver sandwich metal after substrate 2 is mechanically thinned and etched to provide good Ohmic contact and contribute a reduced magnitude of substrate resistance.

Ohmic contact to the top-side source and body rations is also critical to achieve reliable device operation. A source-body-short is important to bias the body at the source potential to eliminate any body-effect induced, threshold shifts, and to prevent parasitic NPN bipolar transistor conduction. The parasitic NPN bipolar transistor comprising N+7 as the parasitic emitter, PB body 5 as the bipolar's base and N− epitaxy 3 as the collector is in parallel with the vertical MOSFET. So long that the emitter-base regions remains shorted during current transients the bipolar remains of and its collector-to-emitter breakdown is equal to the device's $BV_{CES}$, the same as the MOSFET's $BV_{DSS}$. If substantial voltage drop occurs in the silicon so that $V_B > VE$ despite the emitter-to-base surface short, then the N+ region will begin to inject electrons and the bipolar will snapback to a lower breakdown which will likely destroy the device.

An optional deep P+ region dP+ layer 8 may be included in every cell, in a few of the cells, or along the device's periphery and under than gate pad and gate bus regions. If region 8 is doped more heavily than PB body region 5 and is slightly deeper, then avalanche breakdown will occur first in N− epitaxy layer 3 under dP+ diodes 8 and not in the active cells. By avoiding avalanche in the active cells and in PB body regions 5, the likelihood of device snapback from parasitic NPN conduction is greatly reduced. The device is therefore made avalanche rugged.

The on-resistance is made low by integrating a plurality of active trench gated cells at a high density, by doping N− epitaxy layer 3 to the highest possible concentration to meet the requisite breakdown voltage of the device, and by keeping the channel length, the distance between the bottom of N+7 and PB 5, as short as possible without inducing punch-through breakdown. In a device with no deep region 8 in the active cells, the higher the active cell density, the lower the $R_{DS}A$ of the device.

Trench power MOSFETs have become an industry standard device since the early 1990's and are well known in the prior art. A description of a prior art trench DMOS fabrication methods is discussed in U.S. Pat. No. 6,413,822 "A Super-Self-Aligned Trench-Gate DMOS with Reduced On-Resistance" as an example.

Trench power-MOSFETs are manufactured and commercially available in complementary processes. Device 1 of FIG. 1A as shown comprises an N-channel MOSFET while cross section 20 of FIG. 1B illustrates a P-channel trench-gated DMOS transistor. The device parallels the N-channel except that P-conductivity type material is substituted for N-type and vise versa. P-channel fabrication starts with P+ substrate 21 and P-type epitaxial layer 22 with NB body region 24. N+ region 25, P+ source 26, active trench gates 23 with gate oxide 27 and conductive polysilicon embedded gates 28, and gate contact polysilicon 33 in non-active trench 32. Top-side contact is facilitated through gate metal 34 and source metal 31 with barrier metal 30.

Generally the same barrier metal is used for fabricating both N-channel and P-channel trench devices. The doping of polysilicon gate material 28 in device 20 may be either P-type or N-type depending on threshold voltage considerations, but in general P-type polysilicon is preferred for making P-channel devices, and N-type polysilicon is preferred for N-channel devices. Mask sets and cell geometries are interchangeable, meaning the same mask set can be used to make both N-channel and P-channel trench DMOS transistors, generally in only 4 to six masking, steps. Wafer fabrication is much simpler and lower cost than CMOS wafer fabrication. Whether P-channel or N-channel DMS, the drain contact to such vertical devices is made on the wafer's back-side.

A less efficient predecessor to the trench DMOS device is the vertical planar DMOS. Dating back to the late 1970's, the planar DMOS has its channel located along the silicon surface rather than on the side of a vertical trench. N-channel planar DMOS 40 in FIG. 1C illustrates PB body region 43 extends laterally under gate polysilicon 47. N+ source 45 also extends under polysilicon gate 47 but to a lesser extent. The difference in the two junction depths forms the DMOS channel region, where current flows laterally before turning perpendicular to the wafer's surface and flowing vertically into epitaxial layer 42 and out the backside of N+ substrate 41.

Polysilicon gate 47 formed atop gate oxide 46 is typically used as a mask to implant the body region 43. The body is then diffused at a high temperature for twelve to twenty hours to diffuse laterally along the surface and vertically into the epitaxial layer. The N+ source 45 requires little subsequent diffusion to complete the channel structure.

Unlike the trench DMOS devices of FIGS. 1A and 1B, the vertical planar DMOS of FIG. 1C relies on high-temperature diffusion and long times to drive the body region 43 under the gate to form the device's channel region. If the PB region 43 is too shallow the DMOS will exhibit soft I-V characteristics of a device in punch-through breakdown. If on the other hand the depth body 43 is too deep, it will pinch the current flowing in the epitaxial region under gate 47 between adjacent body regions 43. This pinch resistance causes the device's on-resistance to increase and places a very practical limit on the maximum cell density and minimum specific on-resistance achievable using planar DMOS fabrication and structures.

The body diffusion can be replaced with a high energy tilt implant at 45 degrees, thereby implanting dopant at an angle to reach laterally beyond the edge of polysilicon gate 47. The wafers must be rotated during the tilt implant to maintain a directionally uniform penetration beneath the polysilicon gates. The cell density of the planar DMOS structure remains limited since a deeper body region 43, regardless how its formed, has a risk of causing, the unwanted pinching effect and offsetting the lower channel resistance with a greater pinch resistance.

Even so, the vertical planar DMOS can achieve specific on-resistances substantially lower than integrated lateral MOSFETs. Like the trench DMOS, it is a vertical device utilizing backside wafer contact for Ohmic connection to the drain.

For completeness device 60 of FIG. 1D illustrates a P-channel planar DMOS transistor comprising a P+ substrate 61 with P-epitaxial drain region 62, NB body region 63, P+ source 65, P+ contact implant 65, polysilicon gate 67 with gate oxide 66 and interlayer dielectric 69 and top side metal 68. No barrier metal is generally needed since the junctions in the legacy DMOS process are necessarily deeper than used in trench DMOS fabrication.

DMOS Equivalent Electrical Network:

The electrical network of vertical DMOS, whether trench or planar in construction, involves a large number of transistors each of high resistance, connected in a massively paralleled arrangement up to million or even tens of millions of cells, all connected with a common gate, a common source and a common drain. One simplified model of a vertical DMOS power transistor is shown in schematic 80 of FIG. 2A, where devices 81A, 81B, 81C, 81D and more are connected in parallel with a single source connection, a single drain connection, and a single gate connection. By applying a gate voltage above the MOSFET's threshold, the bias turns all the MOSFETs cells "on" in parallel. Parallel conduction through millions of cells results in a low specific on-resistance for the overall device. The total resistance is the resistance of any one cell divided by the number of cells n. A composite on-resistance as low as 4 milliohms have been produced for a single device, even at 30V or greater.

A slightly more detailed equivalent schematic 90 in FIG. 2B illustrates that each device comprises an active channel MOSFET 91 with its associated channel resistance, series drain resistance 94 primarily comprising epitaxial and substrate resistance, source resistance 93 primarily involving top metal and bonding wire resistance, and gate resistance 92 comprising metal and polysilicon gate bus resistance. The magnitude and importance of each resistive component depend on where the particular cell of the transistor is located within the overall DMOS layout, and on the location and number of bond wires used to connect it.

Provided the device is not switched into the megahertz range, the gate resistance 92 can largely be ignored and the source-drain series resistance be lumped into a single resistance term called drain resistance. The resulting equivalent circuit is shown in schematic 100 of FIG. 2C where a vertical N-channel power DMOS is illustrated by MOSFET 101 and series drain resistance 102. Body-to-drain diode 103 is included in the circuit in case the polarity ever reverses across the drain-to-source, causing P-N diode conduction.

While vertical power MOSFETs, either vertical planar DMOS or vertical trench gated DMOS have many performance advantages over lateral devices used in integrated circuits, one of their major disadvantages is their inability to integrated multiple independent devices. This limitation stems from the fact that all these devices share a common drain with other MOSFETS in the die. This issue is illustrated in schematic 120 of FIG. 2D where two vertical DMOS are monolithically integrated into one die. As such MOSFETs 121 and 123 have separate gate contacts G1 and G2, separate source connections S1 and S2, separate drain-to-body diodes 122 and 124, and even separate drain epitaxial resistances 125 and 126. They, however, necessarily share a common substrate and backside drain contact "D". This limitation is a much bigger issue than initially obvious. It limits the utility of vertical DMOS as a device, especially in its application in class D audio amplification.

Class D Audio Speaker Drivers:

The output stage for a class D audio output is typically a set of power MOSFETs configured in an "H-bridge" circuit topology. The speaker driver typically comprises two push-pull complementary half bridges with outputs A and B driven out of phase per speaker.

A complementary half bridge comprises a P-channel power MOSFET with its source tied to the positive supply rail and an N-channel power MOSFET with a grounded source sharing a common drain as its output. As shown in schematic 140 of FIG. 3A, for example high-side P-channel 141 and low-side N-channel 142 form a push-pull or complementary half-bridge with output A. A second complementary half-bridge with output B comprises P-channel 143 and N-channel 144.

Each half-bridge can in theory deliver an output voltage that switches between $V_{cc}$ and ground, for a total voltage swing $\Delta V_{out}$ equal to a full $V_{cc}$. By suspending an electrical load, in this case speaker 145, between nodes A and B of two half-bridges and by driving the two half-bridges out of phase, the voltage polarity across the speaker can reverse from $+V_{cc}$ on node A and ground on node B, to a case where node A is biased to ground and node B is biased at $V_{cc}$, representing a total voltage swing $\Delta V_{out}$ equal to a full $2 \cdot V_{cc}$, double that of the half bridge's drive capability. So for the same supply voltage and load current, an H bridge can deliver twice the output power of a half-bridge.

The advantage of using a P-channel MOSFET such as 141 or 143 as a high-side connected switch is that they are easy to drive. Biasing the gate to $V_{cc}$, its source potential, turns the device off. Biasing a P-channel MOSFET's gate to ground or any voltage more negative than one threshold voltage $V_{tp}$ below its source potential $V_{cc}$, i.e. whenever $V_{GP} < (V_{cc} - V_{tp})$, turns the P-channel "on" and into a conducting state. The gate driver buffer must be designed to limit the maximum gate-to-source voltage to a potential less than the gate oxide rupture voltage $V_{GS(max)}$.

Because P-channel MOSFETs have a specific on-resistance at least twice that of an N-channel with comparable voltage ratings, another popular alternative to the complementary H-bridge is one comprising the two N-channel totem pole half-bridge outputs as shown in circuit 160 in FIG. 3B. A totem pole half-bridge employs two N-channel MOSFETs stacked atop one another where the output of the high-side MOSFET comprises the source of one N-channel device, while the output of the low-side device is the drain of another N-channel device. Using a source-follower high-side device such as MOSFET 161 or 163 and common-source low-side transistor such as MOSFET 162 and 164, this configuration is referred to as a totem-pole output. The term "totem pole" is a metaphor for the electrical connections or circuit topology of the high-side and low-side MOSFETs as a head-to-toe stacking of carved wood statues in ancient North America. The load, in this case speaker 165, is connected between half-bridge outputs A and B.

Like in the complementary H-bridge or half-bridge, an N-channel H-bridge comprising two half-bridge totem-pole outputs are driven out of phase to maximize the power delivered speaker 165. Unlike in driving low-side N-channel MOSFETs 162 and 164, however, high-side devices 161 and 163 are difficult to drive and must employ special floating gate drive circuits to operate properly from rail-to-rail, including driving their gates to voltages higher than $V_{cc}$, the most positive voltage in the system Limitations in Class-D Audio Output Stage Implementation In Class D switching amplifiers, each H-bridge drives a single speaker, so that four power MOSFETs are needed per each speaker output. Accordingly stereo requires 8 power devices, and five-channel surround sound systems need over 20 power MOSFETs, excluding the subwoofer driver.

Aside from fully integrated versions suffering a huge area penalty, class D power amplifier implementations using discrete devices require too many components. Moreover, no package exists to efficiently co-package the large number of discrete power device die and reduce the number of discrete components requiring mounting on a printed circuit board (PCB). Such a package should low thermal resistance, exhibit minimal resistance contributions from bonding and interconnection, and maintain uniform efficiency and drive capability among its audio channels.

Moreover, what is really needed is any design, architecture or circuit technique that enables the number of packaged die to be reduced, ideally down to two or three pieces of silicon, and still employ vertical power MOSFET technology with low specific on-resistance and simple fabrication techniques. Only then can class L) audio amplification be achieved in an efficient and cost effective manner, especially at higher voltages and power outputs.

SUMMARY OF THE INVENTION

The present invention includes several class D audio amplifiers that use vertical power a MOSFET technology with low specific on-resistance and simple fabrication techniques. One such class D audio amplifier uses four P-channel high-side devices paired with four N-channel low-side devices as four half bridges. The N-channel devices share a common ground-connected source and have separate drain connected outputs. Similarly, the P-channel share a common $V_{cc}$-connected source and have separate drain connected outputs.

Using vertical DMOS technology, each power N and P channel device is implemented as a discrete device. The N and P channel devices are paired and the backside metal drain contact of each pair is attached to a shared die pad. The four pairs are included in a package along with leads for $V_{cc}$ and ground (connected to the sources of the N and P channel devices respectively) and leads for the gates of each N and P channel. In a preferred embodiment the die pads comprise copper with lead extending to the package's exterior providing a current path with low electrical resistance and a heat path with low thermal resistance.

A second embodiment of a class D audio amplifier uses eight N-channel devices configured as four totem poles. Each totem includes a high-side N-channel device and a low-side N-channel device. All low-side N-channel devices share a common ground-connected source and have separate drain connected outputs. Conversely, all high-side N-channel devices share a common $V_{cc}$-connected drain and have separate source connected outputs. In a preferred embodiment, the $V_{cc}$-connected N-channels share it common copper die pad including leads extending to the package's exterior providing a current path with low electrical resistance and a heat path with low thermal resistance.

Using vertical DMOS technology, each low-side common-source connected power MOSFET is manufactured as a discrete device. However, all common-drain connected high-side N-channels can share a single piece of silicon. As such, the packaging of such a multi-chip solution requires a leadframe to accommodate six discrete die arranged in a regular and well matched symmetry. For one implementation four die pads are used to mounting the low-side N-channel devices and a fifth die pad is used for mounting the four high-side devices. The entire assembly is enclosed and encapsulated in plastic mold compound. In an alternative embodiment, common-drain connected high-side N-channels can be implemented as two pieces of silicon each comprising dual vertical power MOSFETs. In such implementations a total six die require assembly into a package.

As a preferred embodiment of this invention, a circuit-architecture is newly disclosed that eliminates the problem of co-packaging too many components and avoids the adverse costs associated with such complex assemblies. Instead of utilizing a half-bridge output comprising the aforementioned complementary or totem-pole push-pull configuration its uses an array of common-drain N-channel followers on the high-side and another array of common-drain P-channel followers on the low side.

While it may be considered wasteful, even illogical, to employ P-channel devices on the low-side because of their higher on-resistance for a given die area and the added difficulty imposed in realizing gate drive voltage below ground, it offers an unexpected benefit toward integration when employing vertical power MOSFET devices and fabrication processes. Properly implemented, the unexpected benefits of device integration can more than offset the detriments of higher resistance and complex gate drive.

Specifically, a complementary follower for multiple channels can be realized in only two silicon dice using a monolithic array of grounded P-channel MOSFETs that share a common drain connection. Implemented as vertical P-channel DMOS, either trench-gated or planar, the drain connection comprises the backside of the die. The gate and source connections for each of the common drain P-channel MOSFETs are connected through bond wires to separate pins. In a preferred embodiment, the ground-connected P-channels share a common copper die pad including leads extending to the package's exterior providing a current path with low electrical resistance and a heat path with low thermal resistance.

The pull-up or high-side devices are included, in a second silicon die containing an array of common drain N-channel DMOS power MOSFETs sharing a common drain connected to the positive power supply rail $V_{cc}$. Implemented as vertical N-channel DMOS, either trench-gated or planar, the drain connection comprises the backside of the die. The gate and source connections for each of the common drain N-channel MOSFETs are connected through bond wires to separate pins. In a preferred embodiment, the $V_{cc}$-connected N-channels share a common copper die pad including leads extending, to the package's exterior providing a current path with low electrical resistance and a heat path with low thermal resistance.

In a class D audio amplifier, corresponding source connections from the high and low-side devices are electrically shorted together to form four complementary follower half-bridge outputs. Typically, the high-side N-channel vertical DMOS array is mounted on a $V_{cc}$-connected die pad and the low-side P-channel vertical DMOS array is mounted on a grounded die pad and both are contained in a single plastic package. The Two die pads can be shaped in several different ways for differing distributions with in the package.

To support operation of the complementary follower topology just described, it is necessary to provide gate voltages in excess of the rail voltage for the high-side devices, i.e. greater than the positive supply rail $V_{cc}$. Similarly, it is necessary to provide gate voltages that are less than ground for the low-side devices, gate voltages more negative than the negative supply rail.

One solution is to provide floating gate buffers that include bootstrap circuitry to provide the necessary gate drive voltages. Typically, this can be accomplished by including a bootstrap capacitor to boost the voltage available to drive the high and low-side devices (in the case of the low-side devices it is more accurate to provide a boosted inverted voltage). In one such implementation separate bootstrap gate drive circuitry is required for independent drive of each power MOSFET.

In operation, bootstrap drive involves constant switching where the high-side bootstrap capacitor is alternately charged from the rail voltage and then placed in series with the rail voltage (i.e. with the capacitor's negative terminal connected to $V_{cc}$) to provide a combined rail plus capacitor voltage that exceeds the voltage available from the rail alone. Low-side bootstrap operation is similar but having an inverted polarity and phase involving alternatively charging the bootstrap capacitor from the supply rail and then reconnecting the charged capacitor in series with ground (i.e. with the capacitor's positive terminal connected to ground) to provide a voltage that is more negative than ground.

Using complementary bootstrap drive a push-pull output comprising a complementary MOSFET follower can be implemented with low-resistance and rail-to-rail output drive capability. In one embodiment, the dead band where neither high-side nor low-side MOSFET conducts is controlled by the relative turn-on voltages of complementary level shifting circuitry which may include resistor level shift or cross coupled level shift techniques described below.

A second solution is to provide a power supply (switching or otherwise) that produces a first voltage ($V_{dd}$) that exceeds the rail voltage and a second voltage that is less than ground ($-V_{ee}$) and to utilize these two supply rails to power the complementary gate buffers. Power supplies of this type are described in U.S. Published Patent Application No. 2009/0039711, entitled "Dual-Polarity Multi-Output DC/DC Converters and Voltage Regulators," which is incorporated in this document by reference.

Once the two voltages ($V_{dd}$ and $-V_{ee}$) are available, it becomes a matter of appropriately generating high and low-side gate drives ($V_{GHS}$ and $V_{GLS}$) as a function of an audio input signal. One disclosed method for generating the two gate drives, the complementary resistor level shift method, is to provide a first resistive divider for generating the high side gate drive voltage $V_{GHS}$ as a function of the audio input and a second resistive divider for generating the low side gate drive voltage $V_{GLS}$. The first resistive divider includes a resistor and an NMOS device in series between $V_{dd}$ and ground. In response to the amplifier's audio input signal a digital signal is applied to the gate of the NMOS device varying its gain and $V_{GHS}$ is obtained, between the NMOS device and the resistor, switching between $V_{dd}$ and near ground voltages, in a similar fashion, the second resistive divider includes a resistor and a PMOS device in series between $V_{ee}$ and $-V_{ee}$. The digital control signal acting in response to the audio input signal is applied to the gate of the PMOS device varying its gain and $V_{GLS}$ is obtained between the PMOS device and the resistor, thereby switching between near $-V_{ee}$ and near $V_{ee}$ voltages. The two resistor level shifting circuits are driven out of phase in complementary fashion.

A more efficient method for generating the two gate-drives ($V_{GHS}$ and $V_{GLS}$), herein referred to as complementary cross coupled level shifting, replaces the resistive dividers with an active level shifting topology. For one such topology, a first NMOS device and a first PMOS device are connected in series between $V_{dd}$ and ground. A second NMOS device and a second PMOS device are also connected in series between $V_{dd}$ and ground. The gates of the NMOS devices are cross connected to each other's drains. The audio signal drives the gate of the first PMOS device and its complement drives the gate of the second PMOS device. $V_{GHS}$ is derived between the first PMOS device and the first NMOS device. In effect, the complementarily switched NMOS devices level shift the audio signal and the pair of PMOS devices function as a cross connected as a latch to provide $V_{GHS}$ from $V_{dd}$.

$V_{GLS}$ is derived from $-V_{ee}$ is in a similar fashion except that PMOS devices are used to perform level shifting and NMOS devices are used as the cross-connected latch. The level shifting PMOS devices are connected to $V_{ee}$ and the NMOS devices are connected to $-V_{ee}$.

Both of the topologies just described (i.e., resistive and level-shifting) may be made more robust by adding a second stage. The second stage includes a PMOS device, a first resistor, a second resistor, a third resistor and an NMOS device all connected in series between $V_{dd}$ and $-V_{ee}$. The gate of the PMOS device is controlled by what was described as the $V_{GHS}$ output of the resistive or level-shifting topology. The gate of the NMOS device is controlled by what was described as the $V_{GLS}$ output of the resistive or level-shifting topology. $V_{GHS}$ is derived between the first and second transistor and $V_{GLS}$ is derived between the second and third transistor. Addition of the second stage prevents overdrive of the transistors in the resistive and level-shifting topologies and decreases the likelihood of failure, and by controlling, the dead band where neither high-side nor low-side MOSFETs conduct.

Another method that prevents gate overdrive uses shunt regulators instead of the second stage just described. For one such implementation, two gate buffers are added to the resistive divider topology previously described. One gate buffer supplies the high-side device using the voltage provided by the second resistive divider and the second gate buffer supplies the low-side device using the voltage provided by the second resistive divider. Two Zener diodes are also added. One of these diodes is placed between the source and gate of the high-side device. The second Zener diode is placed between the source and gate of the low-side device. In this way, the gate-source voltage of the high and low-side devices is limited to less than the Zener breakdown voltage $BV_Z$. In such an implementation, a first current source is preferably placed between the $+V_{dd}$ bias supply and the resistive divider and a second current source is placed between the second resistive divider and the $+V_{dd}$ bias supply. This prevents the Zener diodes from being damaged by sourcing too much current. In a similar topology, the Zener diodes can be placed across the power supplies of the gate buffers.

Another shunt regulator clamped level shift circuit (shown in FIG. 14B) uses two CMOS buffers connected in series to the output of the first resistive divider. A Zener diode clamps the voltage applied to the CMOS buffers. The output of the second diode (in the series connection) is applied to the gate of a source follower NMOS device that is connected in series with a second NMOS device between the $-V_{dd}$ bias supply and the source of the high-side device. Since a source follower cannot supply current when its source is within one threshold of its drain voltage, the follower acts like a series regulator to clamp the voltage applied to the high-side device. The voltage applied to the low-side device is regulated using an analogous technique.

Another shunt regulator clamped level shift circuit (shown in FIG. 15) uses series pass regulation, rather than shunt regulation to protect the gates of the high and low-side devices. This topology uses a gate buffer and resistive divider to drive the gate of the high-side device. The gate buffer is powered from the output of a floating linear regulator circuit that includes a PMOS pass element controlled by an amplifier. A resistive divider provides a feedback signal that is compared to a floating voltage reference $V_{ref}$ thereby limiting the maximum voltage applied to gate buffer to a potential safe for the gate oxide of the high-side device. The voltage applied to the low-side device is regulated using an analogous technique.

Many of the class D amplifiers described above require a power supply (or supplies) that produces $V_{dd}$ and $-V_{ee}$ bias voltages. For one such power supply, a first P-channel device, an inductor and an N-channel device are connected between the input voltage $-V_{ee}$ and ground. To simplify this description, it is assumed that a node $V_y$ is located between the first P-channel device and the inductor and a node $V_x$ is located between the inductor and the N-channel device. A second P-channel device connects the node $V_y$ to a first output node (the $-V_{ee}$ output node). The $-V_{ee}$ output node is connected to ground by a first filter capacitor. A third P-channel device connects the node $V_x$ to a second output node (the $+V_{dd}$ output node). The $+V_{dd}$ output node is connected to ground by a second filter capacitor.

Operation of the power supply involves using pulse width modulation or variable frequency techniques to control and regulate two outputs $-V_{ee}$ and $+V_{dd}$. During a first phase of operation, the N-channel device and the first P-channel device are turned on building up current (i.e., magnetizing), the inductor. During this phase the second and third P-channel devices both remain off.

In the second phase of operation the first P-channel device and the N-channel device are both shut off in which case voltage $V_x$ immediately flies up to a positive voltage from the inductor into the $+V_{dd}$ capacitor. At the same time $V_y$ simultaneously flies negative to a below ground potential transferring energy from the inductor into the $-V_{ee}$ capacitor.

The P and N-channel devices remain in this condition until the voltages across the capacitors reach their target value. When the $+V_{dd}$ capacitor reaches its nominal value, the third P-channel device is turned OFF. After a break-before-make interval, the N-channel device is turned back on driving $V_x$ to a voltage near ground. Meanwhile the inductor continues to transfer energy into the $-V_{ee}$ capacitor.

When $-V_{ee}$ finally reaches its nominal value, the second P-channel device is turned OFF and after a break-before-make interval, the first P-channel device is turned back ON driving $V_y$ a to a voltage near $V_{ee}$. Once the first P-channel device and the N-channel device are both conducting current and inductor begins to build up again, replenishing energy lost to filter capacitors and starting the cycle again.

In the sequence just described $V_{dd}$ reached its final value before $-V_{ee}$. Thus, the flow of current to the $V_{dd}$ output node was terminated while the flow of current to $-V_{ee}$ continued. In the alternative (i.e., where $-V_{ee}$ reaches it target value before $V_{dd}$) the opposite operation is performed and the flow of current to the $V_{dd}$ output node continues while the flow of current to $-V_{ee}$ is terminated.

In an alternative embodiment, transfer of energy to the filter capacitors can be alternated with magnetizing, the inductor, i.e. alternating; magnetizing, transferring energy into the $+V_{dd}$ output capacitor, magnetizing, the inductor again transferring energy into the $-V_{ee}$ output capacitor and repeating the cycle.

Another power supply that produces $V_{dd}$ and $-V_{ee}$ bias voltages uses a switched capacitor network to produce both negative and positive bias voltages. Specifically, as shown in FIG. 17 a power supply of this type involves the repeated charging and subsequent discharging of a flying capacitor into two reservoir capacitors using a network of MOSFETs. Operating as switches for completing, and breaking, various circuit paths, the MOSFETs may operate digitally, i.e. having an on and off state, or by limiting current under certain circumstances.

During a charging phase, a PMOS device and an NMOS device are both turned ON connecting the flying capacitor between an input supply $V_{ee}$ and ground. The remaining MOSFETS in the network are turned OFF. As a result, the flying capacitor is charged to approximately $V_{ee}$.

During a first charge transfer phase, the PMOS and NMOS devices are turned OFF. Two more MOSFETS are turned. ON connecting the negative pole of the flying capacitor to the input voltage $V_{ee}$ and the positive pole of the capacitor to the $+V_{dd}$ output capacitor. In this way, the voltage combined voltage of the flying capacitor and the input supply $V_{ee}$ are applied to the $+V_{dd}$ output capacitor. After the first charge transfer phase is repeated several times, the $+V_{dd}$ capacitor will charge to a value approximately equal to twice the input voltage $V_{ee}$.

The charging phase is then repeated. Once completed, a second charge transfer phase is initiated. In the second charge transfer phase, the positive pole of the flying capacitor is connected to ground and the negative pole of the flying capacitor is connected to the $-V_{ee}$ output capacitor. In this way, a voltage of approximately $-V_{ee}$ is applied to the $-V_{ee}$ output capacitor.

Using either one of these methods or by using separate power supplies the bias supplies $+V_{dd}$ and $-V_{ee}$ may be generated to power the gate buffers in class-D audio amplifiers.

As shown in FIG. 18A, the bias supplies $+V_{dd}$ and $-V_{ee}$ may also be generated from the switching action of one half-bridge of a class D audio amplifier. For this type of implementation, the common source output $V_B$ of this half-bridge is AC coupled using two flying capacitors. To generate the positive output, the first flying capacitor is first charged to approximately $V_{ee}$ and then connected in series with the supply voltage $V_{cc}$ to provide current to the $+V_{dd}$ output capacitor. During charging, the first flying capacitor is connected to the power input $V_{ee}$ using a dedicated MOSFET. At the same time, the first flying capacitor is connected to ground through the half-bridge. During discharge, the first flying capacitor is connected to $V_{ee}$ through the half-bridge and connected to the $+V_{dd}$ output capacitor using another dedicated MOSFET.

To generate the negative output $-V_{ee}$, the second flying capacitor is second charged to approximately and then connected between the $-V_{ee}$ output capacitor and ground. During charging, the second flying capacitor is connected to the ground using a dedicated MOSFET. At the same time, the second flying capacitor is connected to the power input $V_{ee}$ through the half-bridge. During discharge, the second flying capacitor is connected to ground through the half-bridge and connected to the $-V_{ee}$ output capacitor using another dedicated MOSFET.

As shown in FIG. 18D, the bias supplies $+V_{dd}$ and $-V_{ee}$ may also be generated from the switching action of a full bridge of a class D audio amplifier. In this circuit when VA is at ground, a first flying capacitor is connected between VA (ground) and $V_{ee}$. The connection to $V_{ee}$ is made using a dedicated MOSFET. When VA is at $V_{ee}$ the first flying capacitor is connected in series with VA ($V_{ee}$) to provide current to the $V_{ee}$ output capacitor. The charge/discharge is repeated out of phase for the node $V_B$. The net effect is the $+V_{dd}$ output capacitor is being charged in every switching phase similar to that of a full-wave bridge rectifier in an AC-to-DC converter. The $-V_{ee}$ bias voltage is generated using an analogous technique.

Using the aforementioned methods, integrating the H-bridge complementary-follower with bias generator and speaker drivers for class-D audio applications can be achieved in three silicon die which may be packaged separately or assembled into a single plastic package. For example, FIG. 19A shows a three die assembly that includes a controller IC, a P-channel vertical DMOS power MOSFET array, and an N-channel vertical DMOS power MOSFET array. An alternate package solution is shown in FIG. 19B.

BRIEF DESCRIPTION OF THE DRAWINGS

FIG. 1A is an N-channel trench DMOS, FIG. 1B is a P-channel trench DMOS, FIG. 1C is an N-channel planar DMOS and FIG. 1D is a P-channel planar DMOS.

FIG. 2A is a parallel array of ideal MOSFETs. FIG. 2B is a MOSFET array with parasitic resistances. FIG. 2C is an equivalent device with parasitic drain resistance and FIG. 2D is a split source DMOS with parasitic drain resistance.

FIG. 3A shows two complementary half-bridge outputs and FIG. 3B shows two totem-pole N-channel complementary half-bridge outputs.

FIG. 4A is a schematic and FIG. 4B is plan view of a package lead-frame including die.

FIG. 5A is a schematic and FIG. 5B is plan view of a package lead-frame including die. FIG. 5C is a plan view of alternate pin out lead-frame including die.

FIG. 6A is a schematic of a dual-die implementation. FIG. 6B is plan view of a package lead-frame including, die. FIG. 6C is plan view of an alternate package lead-frame including die.

FIG. 12a is system schematic. FIG. 12B is a level shifting gate driver schematic and FIG. 12C is an improved level shifter schematic.

FIGS. 19A through 19D show an H-bridge complementary-follower speaker driver for class-D audio applications with integral complementary bootstrap bias generator. FIG. 19A is plan view of lead-frame and triple-die assembly. FIG. 19B is an alternate plan view. FIG. 19C is a plan view illustrating; optional stitch-bond and FIG. 19D is a cross section of a stitch bond.

DETAILED DESCRIPTION OF THE INVENTION

Figure 1A:
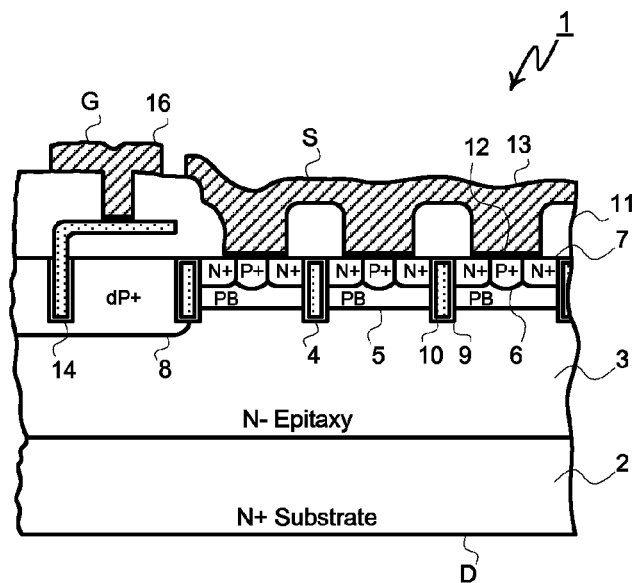
FIGS. 1A through 1D are cross sections of prior art vertical power MOSFETs.
Figure 1B:
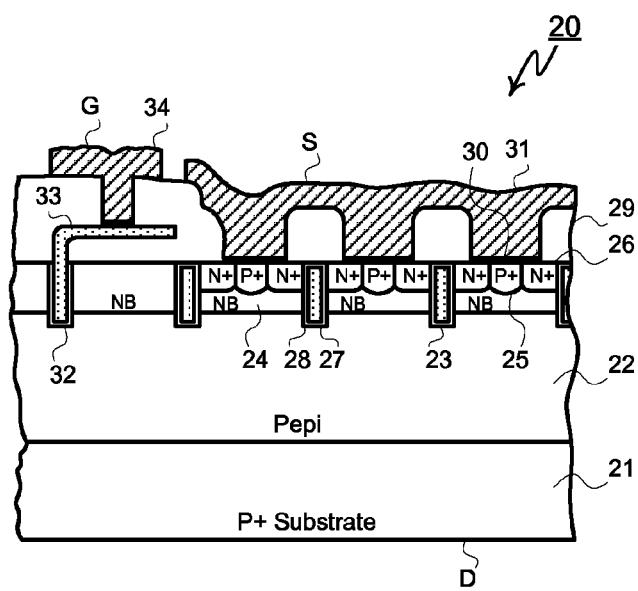
Figure 1C:
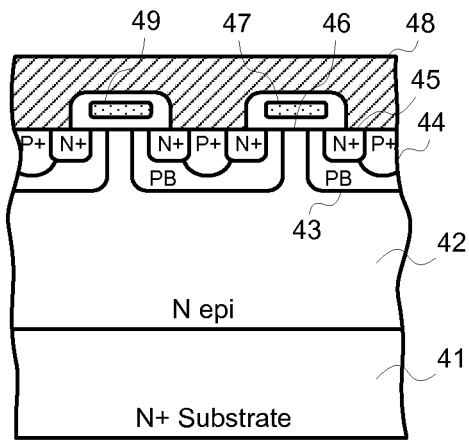
Figure 1D:
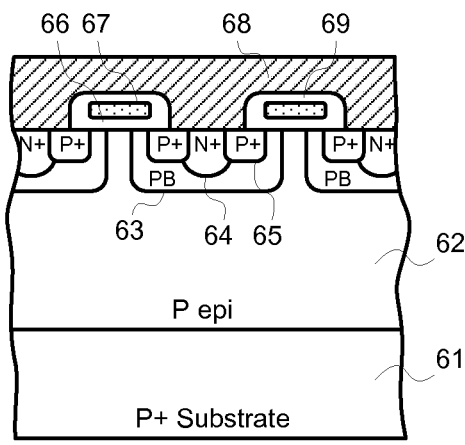
Figure 2A:
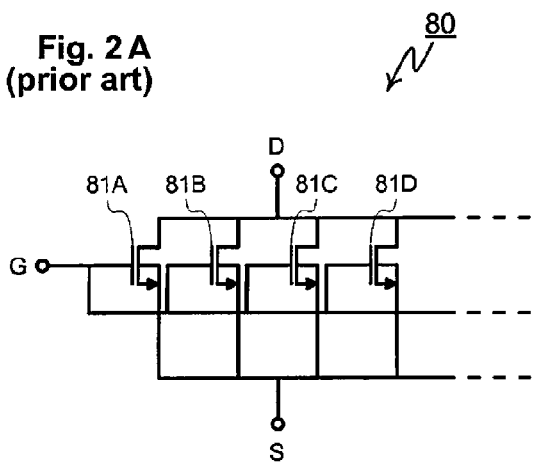
FIGS. 2A through 2D are schematic representations of prior art vertical power MOSFETs.
Figure 2B:
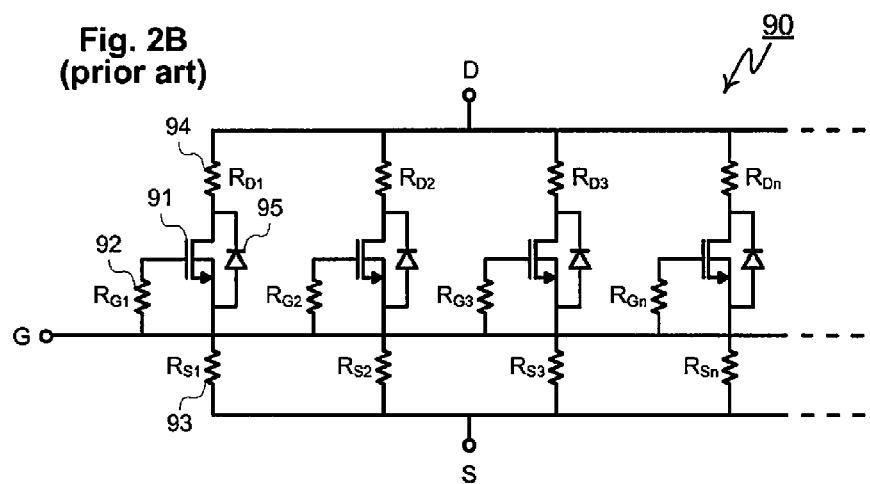
Figure 2C:
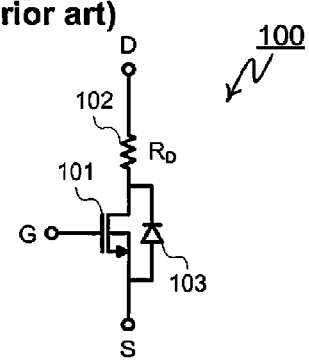
Figure 2D:
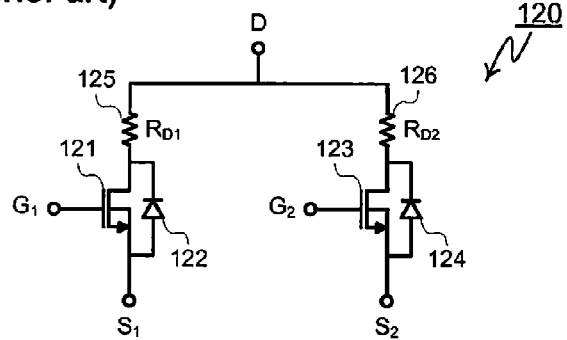
Figure 3A:
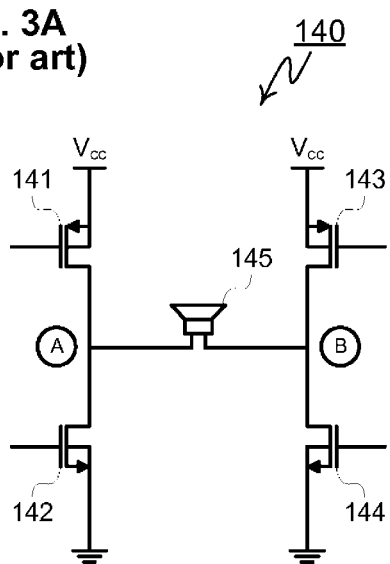
FIGS. 3A and 3B are schematic representations of prior art H-bridge speaker drivers for class-D audio amplification.
Figure 3B:
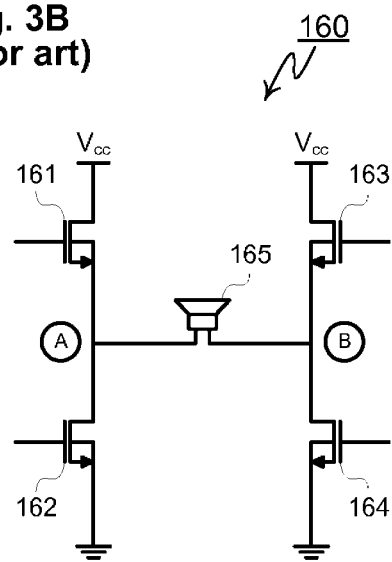

Implementation of class-D audio amplification involves several elements, primarily the class D audio signal processing, the gate drive and level shifting circuitry, the DMOS output stage and in some cases a dedicated bias supply for the gate drivers. The disclosed invention considers all of these elements except for the requisite signal processing.

H-Bridge Assembly of Vertical DMOS

FIG. 4 illustrates a schematic representation of stereo class-D audio system 180 comprising four complementary half-bridge outputs A, B, C and D with a common class D audio signal processor 181. Each complementary half bridge comprises P-channel high-side device 184A through 184D, low-side N-channel 183A through 183D, and break-before-make (BBM) buffer 182A through 182D, to produce outputs A through D respectively. All N-channel DMOS 183 share a common ground-connected source and have separate drain connected outputs. Similarly, All P-channel DMOS 184 share a common $V_{cc}$-connected source and have separate drain connected outputs.

Using vertical DMOS technology, each power MOSFET is manufactured as a discrete device and cannot be integrated with any other devices. The packaging of such a multi-chip solution requires a leadframe to accommodate eight discrete die arranged in a regular and well matched symmetry. For example, the plan view in FIG. 4B of package leadframe and die 200 illustrates a multi-element copper leadframe including die pads 201A through 201D for mounting P-channel vertical DMOS 205A through 205D, and on the same die pad for mounting vertical N-channel DMOS 204A through 204D.

N-channel and P-channel vertical DMOS 204A and 205A both include backside metalized drain contacts, typically comprising a deposited tri-metal back-metal sandwich of titanium, nickel, and silver. The dice are typically die-attached to die pad 201A using silver-filled conductive epoxy although soft solder can also be employed. Leads connected to the pad 201A provide electrical connections to pins labeled "A" while providing mechanical support to the surrounding leadframe rails during assembly, i.e. before trim and form operations. Similarly, N-channel 204B and P-channel 205B share die-pad 201B with attached output pins "B". The die pad connected pins also provide heat sinking of the power devices.

As shown, source bond wires connect the top of N-channel DMOS die 204A and 204B to common GND connected pins 203A. Two wires per die are employed to minimize the resistance contribution of the bond wires. Similarly, source bond wires connect the top of P-channel DMOS die 205A and 205B to common $V_{cc}$-connected pins 203C. Two wires per die are employed to minimize the resistance contribution of the bond wires. Gate wires G1 through G4 are connected to separate pins 202.

In similar arrangement. N-channel 204C and P-channel 205C share die pad 201C with "C" connected pins, N-channel 204D and P-channel 205D share die pad 201D with "D" connected pins, and where N-channels 204C and 204D include source bond wires tied to ground connected pins 203B, and P-channels 205C and 205D include bond wires to $V_{cc}$-connected pins 203D. The entire assembly is enclosed and encapsulated in plastic mold compound 210.

Figure 5A:
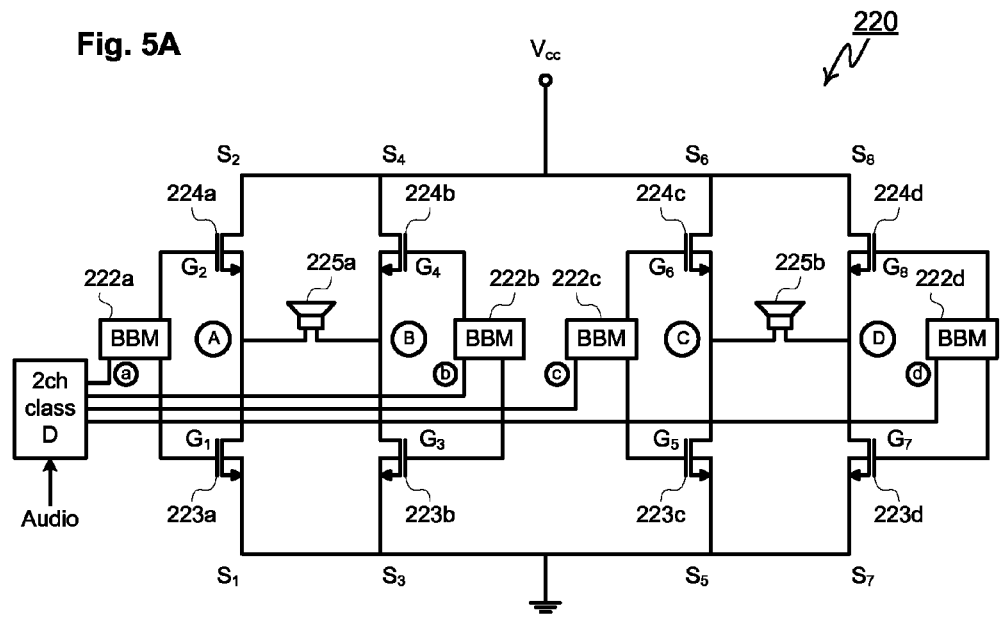
FIGS. 5A through 5C show a stereo class-D audio speaker driver that includes four totem-pole half-bridge outputs.
Figure 5B:
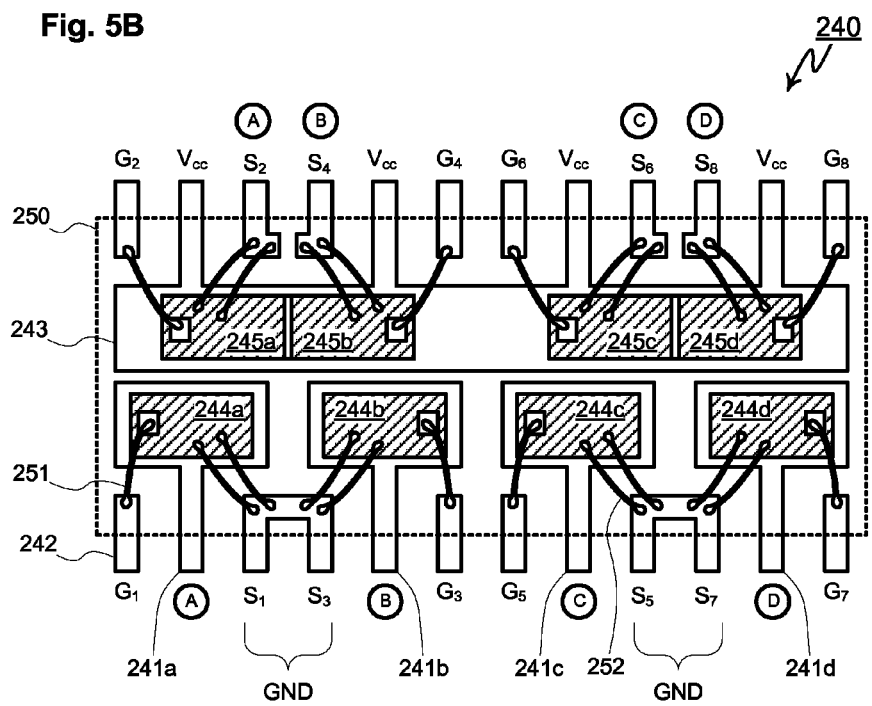

FIG. 5 illustrates a schematic representation of stereo class-D audio system 210 comprising four totem-pole N-channel half-bridge outputs A, B, C and D with a common class D audio signal processor 221. Each complementary half bridge comprises N-channel high-side device 224A through 224D, low-side N-channels 223A through 223D, and break-before-make (BBM) buffer 222A through 222D, to produce outputs A through D respectively. All low-side N-channel DMOS 183 share a common ground-connected source and have separate drain connected outputs. Conversely, all high-side N-channel DMOS 224 share a common $V_{cc}$-connected drain and have separate source connected outputs.

Using vertical DMOS technology, each low-side common-source-connected power MOSFET is manufactured as a discrete device and cannot be integrated with any other devices. All common-drain connected high-side N-channels 224 can share a single piece of silicon. If the aspect ratio, the ratio of die length to die width, is too extreme for manufacturing the common drain high-side N-channels as one die, they may be split into two as shown in assembly 240.

As such, the packaging of such a multi-chip solution requires a leadframe to accommodate six discrete die arranged in a regular and well matched symmetry. For example, the plan view in FIG. 5B of package leadframe and die assembly 240 illustrates a multi-element copper leadframe including die pads 241A through 241D for mounting low-side N-channel vertical DMOS 244A through 244D, and a separate die pad 243 for mounting high-side vertical N-channel DMOS 245A through 245D as one or two dice.

N-channel vertical DMOS 244 and 245 both include backside metalized drain contacts, typically comprising a deposited tri-metal back-metal sandwich of titanium, nickel, and silver. The dice are typically die-attached to die pads 241 or 243 using silver-filled conductive epoxy although soft solder can also be employed. Leads connected to die pads 241 and 243 provide electrical connections to the pins while providing mechanical support to the surrounding leadframe rails during assembly, i.e. before trim and form operations. The die pad connected pins also provide heat sinking of the power devices.

As shown source bond wires connect the top of N-channel DMOS die 244A and 244B to common GND connected pins 246A. Two wires per die are employed to minimize the resistance contribution of the bond wires. Similarly, source bond wires connect the top of N-channel DMOS die 245A and 245B to output-connected pins 247A and 247D. Two wires per die are employed to minimize the resistance contribution of the bond wires. Gate wires 251 G1 through G4 are connected to separate pins 242.

In similar arrangement. N-channel 244C employs dedicated die pad 241C with "C" connected pin, N-channel 244D employs die pad 241D with "D" connected pins, and where N-channels 246C and 246D share $V_{cc}$ connected die pad 243 and include separate source bond wires tied to output connected pins 247C, and 247D. The entire assembly is enclosed and encapsulated in plastic mold compound 250.

In its application in a class D amplifier, assembly 240 requires low-side N-channel drain pin 241A to be connected on the primed circuit board to high-side source pin 247A to electrically complete the half-bridge as output "A". Similarly, board level connections are needed to short low-side drain connections 241B, 241C, and 241D to respective high-side follower outputs 247B, 247C and 247D.

Figure 5C:
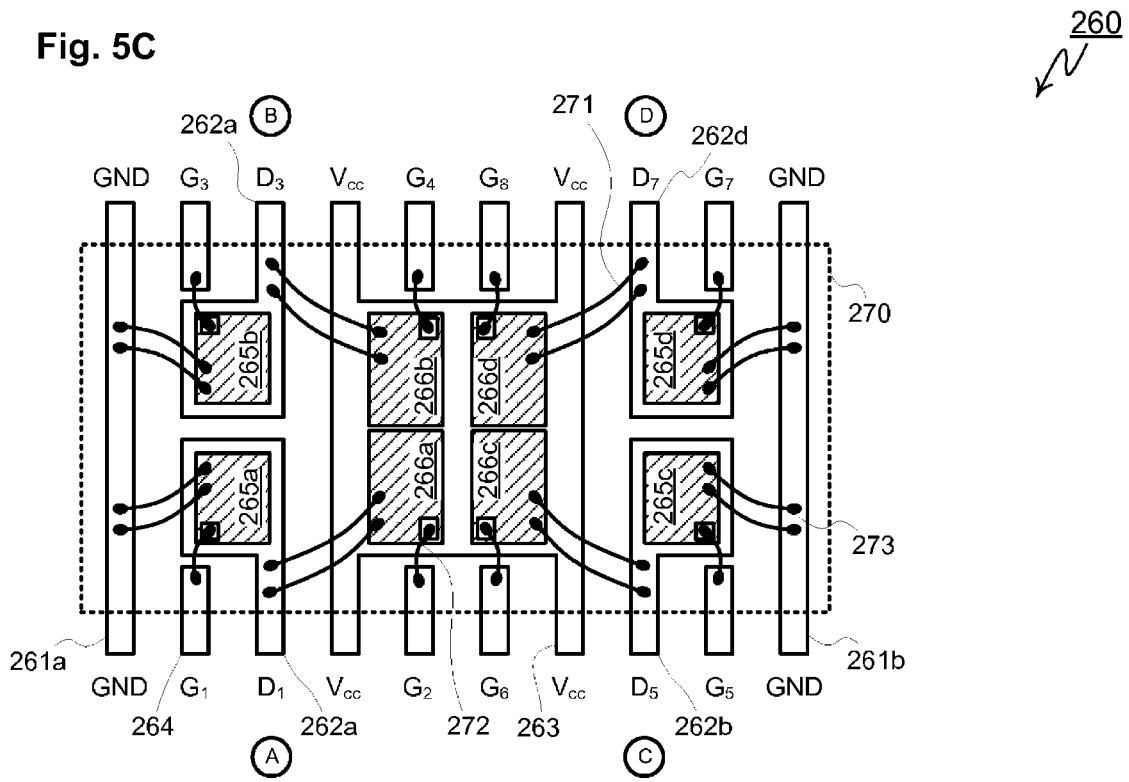

In an alternative assembly 260 shown in FIG. 5C, all four high side N-channels 266A through 266D share a common piece of silicon and have a relatively square aspect ratio. The common drain high-side devices are mounted onto a common H-shaped leadframe piece 263 connected using bond wires 272 to connect the individual MOSFET gates to distinct and separate pins G2, G4, G6 and G8. The H-shaped die-pad offers superior mechanical stability during the assembly and packaging process.

Surrounding H-shaped $V_{cc}$-connected die pad 263, separate die pads 262A through 262D are employed to mount discrete low-side MOSFETs 265A through 265D respectively. The source connections of high-side N-channels 266 are connected by bond wires 272 to the die-pad connected pins 262A through 262D, electrically connecting high-side source and low-side drains to produce outputs A, B, C and D. The source connections of low-side DMOS 265 are connected by bond wires 273 to grounded pin straps 261A and 261B located at the package's edges. The entire eight-MOSFET assembly 260, containing five distinct pieces of silicon, is molded by plastic 270 to complete the packaged solution.

Even through assembly 260 requires only five die, the assembly and the electrical yield of multi-chip packaging is much higher using only three and ideally only two dice in the assembly process. This is because is manufacturing, the assembly yields $Y_n$ for each of N mounted die multiply, i.e. $Y_{total} = Y_1 \cdot Y_2 \cdot Y_3 \cdot Y_n$.

But as shown previously, the common source N-channel low-side MOSFET solution forces manufacturers to use four discrete low-side N-channels device. Complementary highs-side P-channel devices require another 4 devices in the same package, compared to one or two additional dice using high-side N-channel devices and totem pole outputs. Even with five separate dice, the manufacturing yield and finished-goods cost is adversely affected.

New Complementary Follower Architecture

As another embodiment of this invention, a circuit-architecture is newly disclosed that eliminates the problem of co-packaging too many components and avoids the adverse costs associated with such complex assemblies. Instead of utilizing a half-bridge output comprising the aforementioned complementary or totem-pole push-pull configuration its uses a circuit topology never used for class-D power output stages.

The alternative topology described herein is a complementary follower, comprising an array of common-drain N-channel followers on the high-side and another array of common-drain P-channel followers on the low side. Clearly, ground connected P-channel MOSFETs have a higher specific resistance than N-channels and require special gate drive circuitry too.

So while it may be considered wasteful, even illogical, to employ P-channel DMOS on the low-side, it offers an unexpected benefit toward integration when employing vertical power MOSFET devices and fabrication processes. Properly implemented, the unexpected benefits of vertical device integration can more than offset the detriments of a P-channel's higher resistance (as compared to N-channel MOSFETs) and the complex gate drive required by P-channel followers.

Figure 6A:
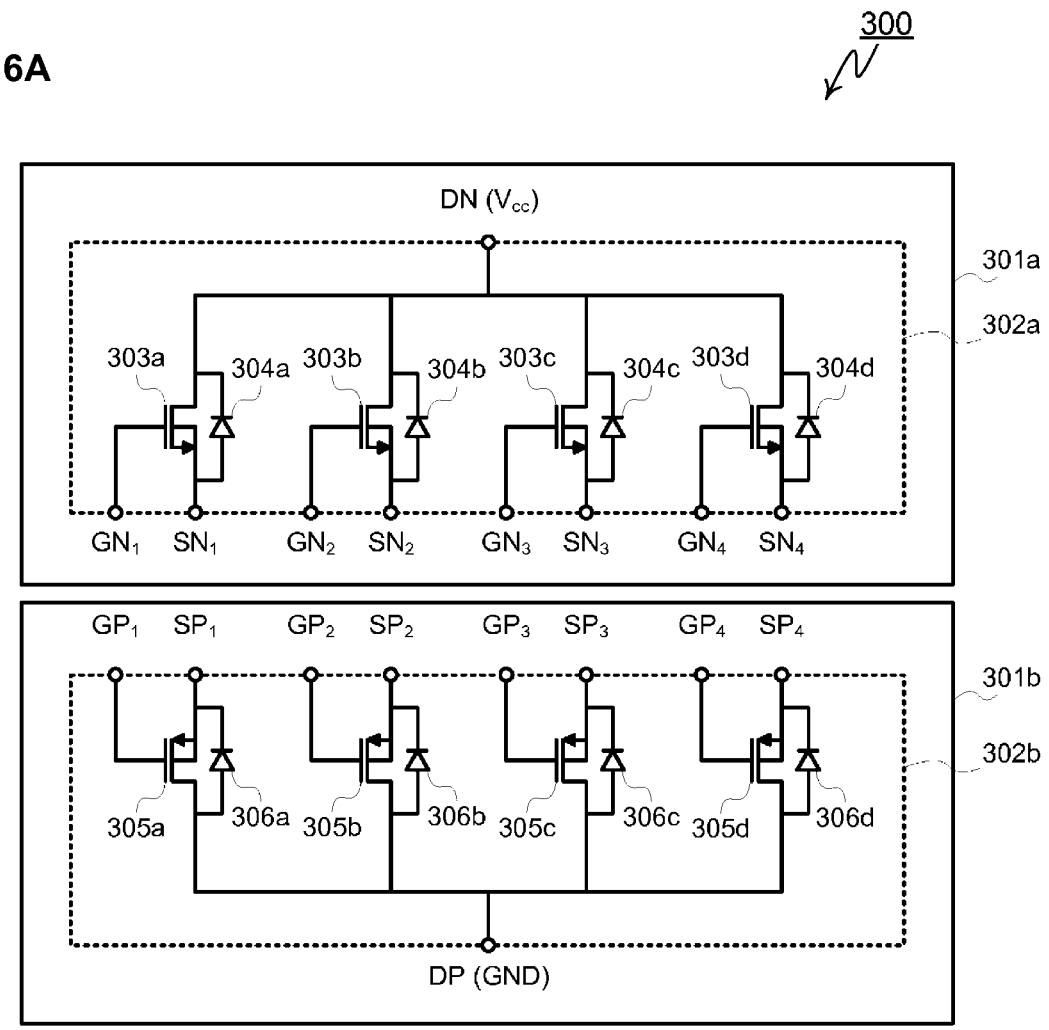
FIGS. 6A through 6C show a stereo speaker driver for class-D audio comprising four complementary follower outputs.

Specifically, a complementary follower for multiple channels can be realized in only two silicon dice as shown in schematic 300 of FIG. 6A, where a monolithic array 202B of grounded P-channel MOSFETs 305A, 305B, 305C and 305D share a common drain connection DP. Implemented as vertical P-channel DMOS, either trench-gated or planar, the DP connection comprises the backside of the die. The die's backside as shown is attached to a common conductive die pad 301B, providing electrical and thermal connections to the common drain P-channel DMOS power MOSFET array.

The gate and source connections for each of the common drain P-channel MOSFETs are connected through bond wires to separate pins. Transistor 305A for example has its source connected to pin SP1 its gate connected to pin GP1, and its drain tied to common drain pin DP. By grounding the DP pin and biasing the source of DMOS 305A with only positive voltages, the MOSFET's integral drain-body diode 306A remains reversed biased at all times. Similarly diode 306B within P-channel DMOS 305B remains reversed biased, as does intrinsic diode 306C in DMOS 305C and intrinsic diode 306D in DMOS 306D.

The pull-up or high-side devices in multi-channel complementary follower circuit 300 comprise a second silicon die 302A containing an array of common drain N-channel DMOS power MOSFETs 303A, 303B, 303C and 303D sharing a common drain connection DN connected to the positive power supply rail $V_{cc}$. Implemented as vertical N-channel DMOS, either trench-gated or planar, the DN connection comprises the backside of the die. The die's backside of silicon 302A as shown is attached to a common conductive die pad 301A, providing electrical and thermal connections to the common drain N-channel DMOS power MOSFET array.

The gate and source connections for each of the common drain N-channel MOSFETs are connected through bond wires to separate pins. Transistor 303A for example has its source connected to pin SN1, its gate connected to pin GN1, and its drain tied to common drain pin DN. By powering the ON pin with the most positive circuit voltage $V_{cc}$ and biasing the source of DMOS 303A with only voltages more negative than $V_{cc}$, the MOSFETs integral drain-body diode 304A remains reversed biased at all times. Similarly diode 304B within N-channel DMOS 303B remains reversed biased, as does intrinsic diode 304C in DMOS 303C and intrinsic diode 304D in DMOS 303D.

In a class D audio amplifier, corresponding source connections SN and SP are electrically shorted together to form multiple complementary follower half-bridge outputs, in this example, four. For example, connecting pins SN1 and SP1 together electrically forms half-bridge "A" comprising N-channel high-side DMOS 303A and P-channel low-side DMOS 305A, both as source followers. For any output voltage between ground and $V_{cc}$, both diodes 304A and 306A remain reverse biased. Similarly, pins SN2 and SP2 connect MOSFETs 303B and 305B to produce output B, pins SN3 and SP3 connect MOSFETs 30CB and 305C to produce output C, and pins SN4 and SP4 connect MOSFETs 303D and 305D to produce output D.

Figure 6B:
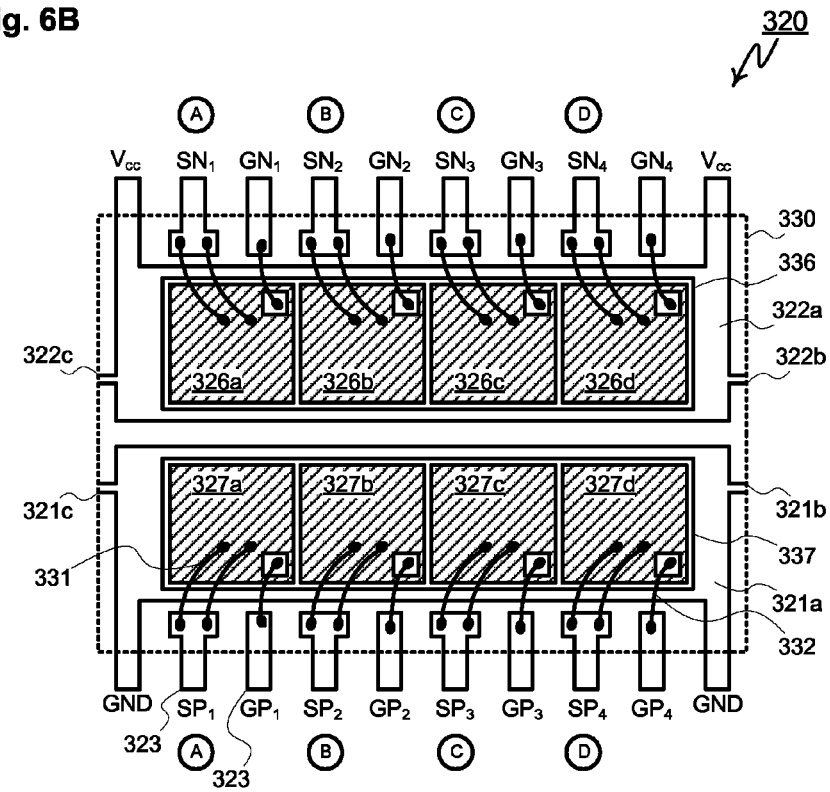

Using a complementary source follower implementation, FIG. 6B illustrates a plan view of assembly 320 comprising high-side N-channel vertical DMOS array 336 mounted on $V_{cc}$-connected die pad 322A and low-side P-channel vertical DMOS array 337 mounted on grounded die pad 321A, all contained within 20-pin plastic package 330.

N-channel high-side array 336 includes four common-drain N-channel MOSFETs 326A, 326B, 326C and 326D with corresponding source outputs SN1, SN2, SN3, and SN4 and respective gate connections GN1, GN2, GN3 and GN4. The backside drain of die 136 is connected to $V_{cc}$ through a conductive epoxy die attach to copper leadframe 322A. As part of die pad 322A, two $V_{cc}$-connected leads provide a low resistance electrical connection to the N-channel MOSFETs common drain, facilitate a heat path from die 336 to the printed circuit board, and provide mechanical support during the assembly process. Tie bars 322B and 322C provide added stability during the die attach process.

P-channel low-side array 337 includes four common-drain P-channel MOSFETs 327A, 327B, 327C and 327D with corresponding source outputs SN1, SN2, SN3, and SN4 and respective gate connections GP1, GP2, GP3 and GP4. The backside drain of die 337 is connected to $V_{cc}$ through a conductive epoxy die attach to copper leadframe 321A. As part of die pad 321A, two ground-connected leads provide a low resistance electrical connection to the P-channel MOSFETs common drain, facilitate a heat path from die 337 to the printed circuit board, and provide mechanical support during the assembly process. Tie bars 321B and 321C provide added stability during the die attach process.

As shown, gold or aluminum wire bonds 331 are used to connect the source outputs of the vertical MOSFETs to T-shaped copper leads 323. Gate connections use bond wires 332 to connect to straight leads 324. To complete the connection, printed circuit board traces are used to electrically connect pins SN1 and SP1 to form output A; pins SN2 and SP2 to form output B; pins SN3 and SP3 to form output C; pins SN4 and SP4 to form output D. Alternatively, a stitch wire bond may connect the source of N-channel 326A to the source of P-channel 327A and to leads SN1 and SP1 inside the package itself.

Figure 6C:
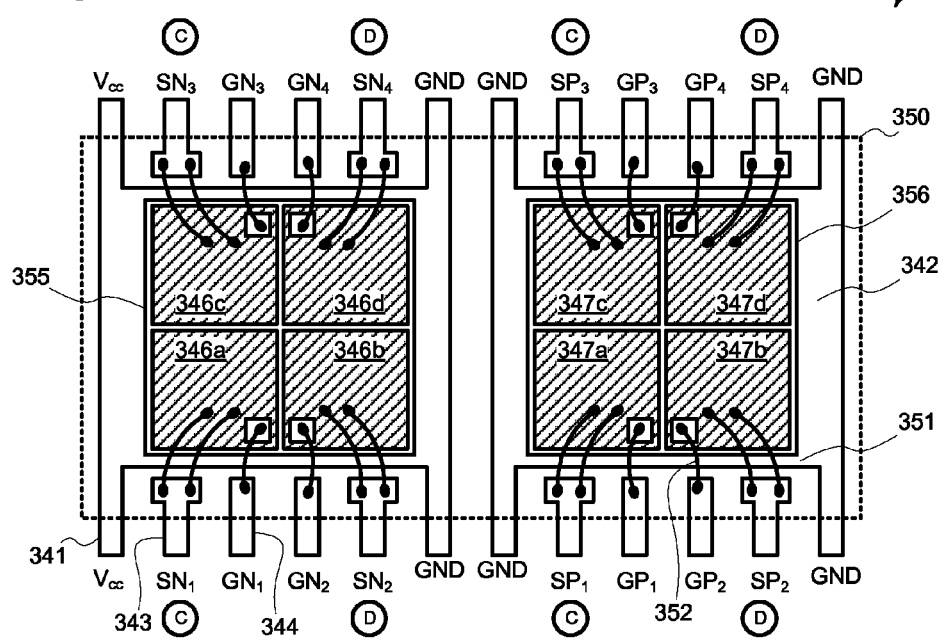

FIG. 6C illustrates an alternative assembly plan view 340 comprising two H-shaped die pads 341 and 342 used for mounting vertical N-channel DMOS power MOSFET die 355 and vertical P-channel die 356, respectively. The unique H-shaped die pad provides low thermal and electrical resistance while offering superior mechanical strength during assembly without the need for tie bars. The entire assembly is housed in 24-pin plastic package 350.

Internal to assembly 340, N-channel DMOS array 355 includes MOSFETs 346A, 346B, is 346C and 346D with corresponding source connections SN1, SN2, SN3 and SN4 and corresponding gate connections GN1, GN2, GN3 and GN4. The backside of die 355 forms the common drain of the N-channel vertical DMOS array and is connected to $V_{ee}$ through H-shaped copper lead frame 341. In similar construction, P-channel DMOS array 356 includes MOSFETs 347A, 347B, 347C and 347D with corresponding source connections SP1, SP2, SN and SP4 and corresponding gate connections GP1, GP2, GP3 and GP4. The backside of die 356 forms the common drain of the P-channel vertical DMOS array and is connected to ground through H-shaped copper lead frame 351.

Source bond wires 351 connect the surface of the DMOS to T-shaped leads 343. Gate bond wires 352 connect the individual MOSFET gates to leads 344. An area efficient low-resistance package with four half-bridge outputs A, B, C and D is therefore facilitated using only two silicon dice, 355 and 356.

Figure 7:
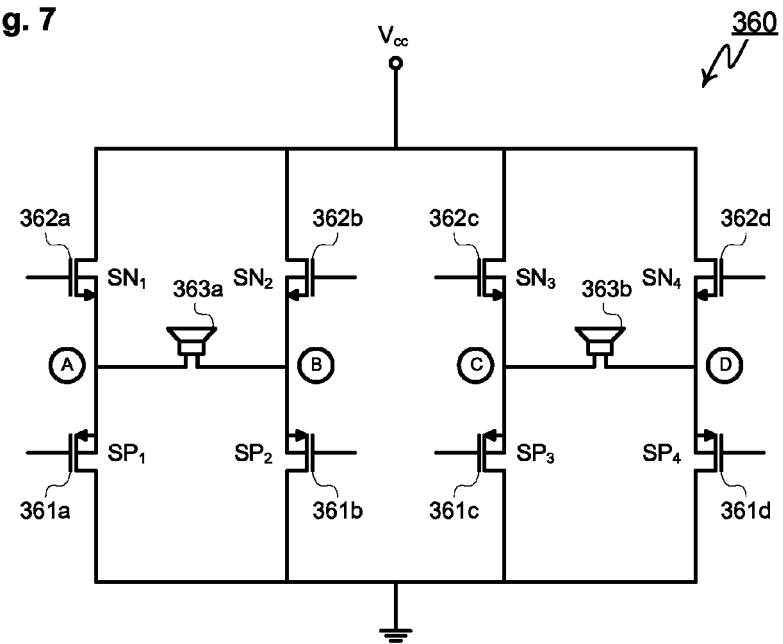
FIG. 7 is a schematic representation of a stereo speaker driver for class-D audio comprising four complementary follower outputs.

Using half-bridges comprising complementary followers, the power circuit for class-D audio amplification can be realized with circuit 360 of FIG. 7. As such speaker 363A is driven by two $V_{cc}$-connected high-side N-channel MOSFET source followers 362A and 362B with output pins SN1 and SN2 connected to pins SP1 and SP2 of grounded P-channel source follower MOSFETs 361A and 361B. In a preferred embodiment outputs A and B are driven out of phase to maximize the power output of the amplifier for a given supply voltage $V_{cc}$.

Similarly, speaker 36BA is driven by two $V_{cc}$-connected high-side N-channel MOSFET source followers 362C and 362D with output pins SN3 and SN4 connected to pins SP3 and SP4 of grounded P-channel source follower MOSFETs 361C and 361D. En a preferred embodiment outputs C and D are driven out of phase to maximize the power output of the amplifier for a given supply voltage $V_{cc}$.

Operation of half-bridge outputs A and B is completely independent of C and D. Even so grounded P-channel MOSFETs 361A, 361B, 361C and 361D may share a common silicon die using a P-channel vertical DMOS power MOSFET process with low-specific on-resistance. Using principals of symmetry, $V_{cc}$-connected N-channel MOSFETs 362A, 362B, 362C and 362D may also share a common silicon die using an N-channel vertical DMOS power MOSFET process with low-specific on-resistance.

Figure 4A:
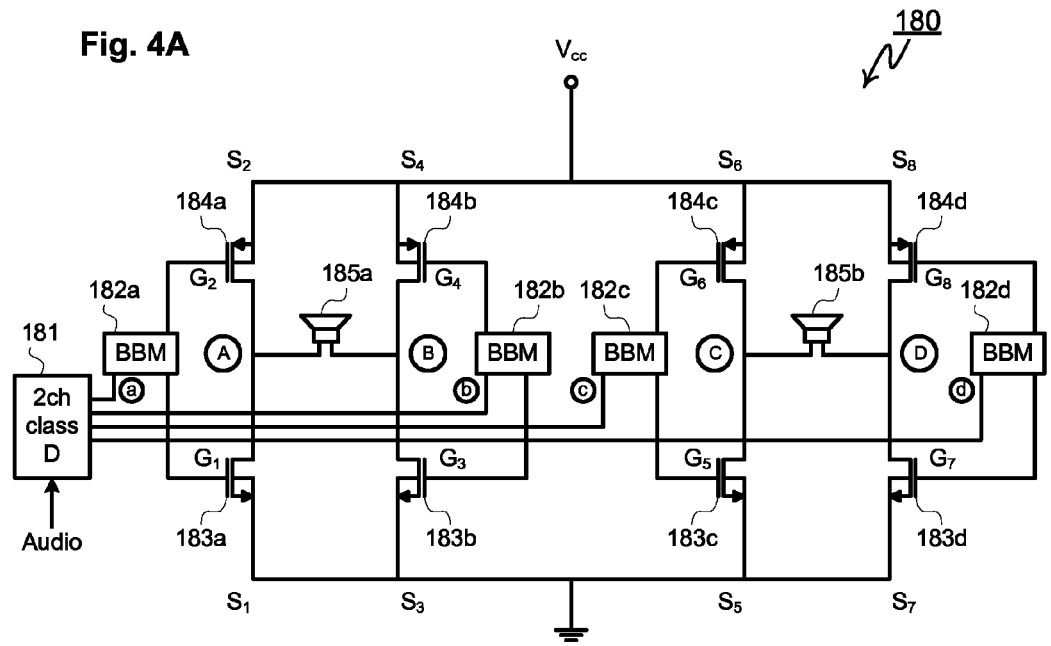
FIGS. 4A and 4B show a stereo class-D audio speaker driver that includes four complementary half-bridge outputs.
Figure 4B:
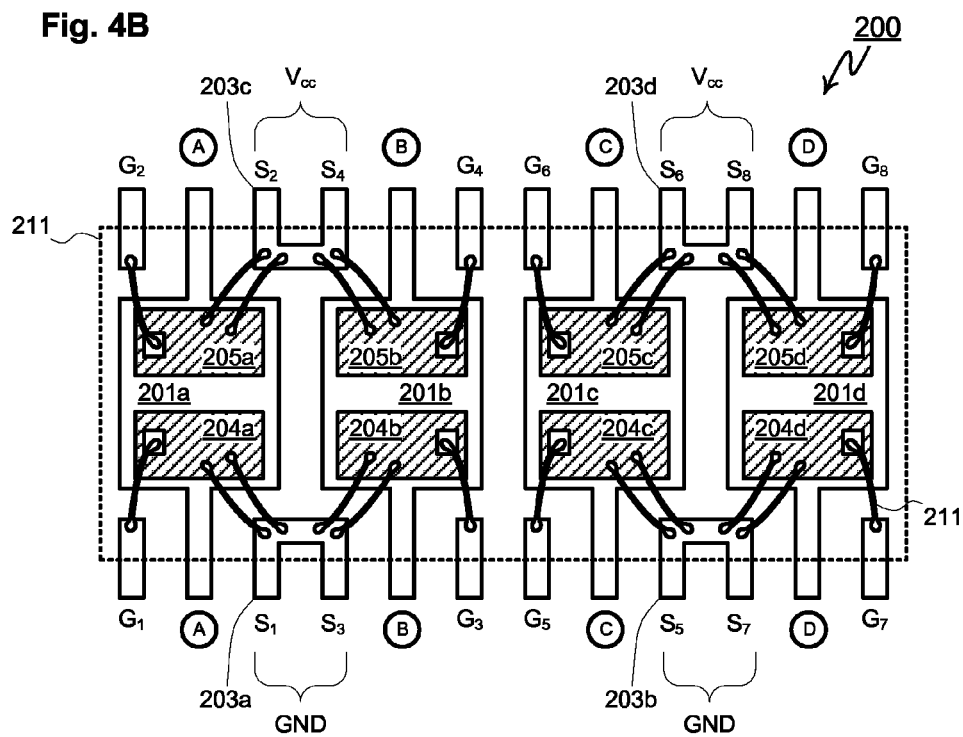

The entire stereo class-D amplifier can then be realized in a small area with efficient low on-resistance vertical power MOSFETs. The complementary follower architecture is counter intuitive and is not used in power applications. In fact, conventional CMOS circuit design teaches forming power push-pull buffers using grounded low-side N-channel MOSFETs combined with high-side $V_{cc}$-connected P-channel MOSFETs. Such "common-source" configured CMOS buffers connect the transistors source connections to their respective supply rails and short the drain connections together to form the output. As illustrated in FIGS. 4A and 4B, such a common source approach requires the assembly of 8 separate dice just to form a stereo output.

Since conventional CMOS design methods teach the use of complementary common source configured push-pull outputs, they actually teach away from the use of complementary follower configured outputs in class D power amplifiers. As such, physical realization of a stereo power output requires a large number a components or integration using monolithic integration.

In contrast, using the complementary follower architecture of circuit 360 in FIG. 7 makes integration compatible with vertical DMOS fabrication methods and structures, in either assembly 320 of FIG. 6B or 340 of FIG. 6C, a full stereo class D amplifier's power stage can be realized using only two silicon dice mounted in a single package.

The area and cost advantage of such an approach can be estimated using some conservative "rules-of-thumb" to make some simple comparisons. Assume for example the specific on-resistance $R_{DS}A$ of lateral 30V MOSFET is four times that of comparable vertical DMOS devices and that P-channel MOSFETs have a resistance 2.5 times that of a comparably constructed N-channel MOSFET. Assume furthermore that vertical DMOS require six masking operations to manufacture while most CMOS IC processes require 18 layers, roughly triple the cost of the vertical discrete manufacturing process. A summary table is shown here with $R_{DS}A$ a and cost relative to vertical N-channel TrenchDMOS devices fabricated using 0.4 micron design rules and a 287 Mcells/in² active cell density.

|  | Technology | | | |
| --- | --- | --- | --- | --- |
|  | TrenchDMOS | | CMOS | |
| Polarity | N-channel | P-channel | N-channel | P-channel |
| $BV_{DSS}$ | 30 V, rugged | 30 V, rugged | 30 V, fragile | 30 V, moderate |
| $R_{DS}A$ | 1 | 2.5 | 4 | 10 |
| Cost | 1 | 1 | 3 | 3 |

Using the above relative factors we can calculate and compare the area needed to achieve full stereo class D amplification using eight transistors to form four half-bridges using various approaches.

|  | Topology | | | |
| --- | --- | --- | --- | --- |
|  | Common Source | Totem Pole | Common Source | Source Follower |
| Low-Side-Switch | N-ch TDMOS | N-ch TDMOS | NMOS (IC) | P-ch TDMOS |
| High-Side-Switch | P-ch TDMOS | N-ch TDMOS | PMOS (IC) | N-ch TDMOS |
| Area 4*$A_{LSS}$ | 4 | 4 | 16 | 10 |
| Area 4*$A_{HSS}$ | 10 | 4 | 40 | 4 |
| Total A (stereo) | 14 | 8 | 56 | 14 |
| Die cost Y = 100% | 14 | 8 | 168 | 14 |
| # of Dice | 8 | 5 or 6 | 1 | 1 |
| Pkg Yield | 72% | 82% or 78% | 96% | 92% |
| Yielded Cost | 19.4 | 9.8 or 10.3 | 175 | 15.2 |
| Assembly UPH | Very Poor | Poor | Very High | Very High |

From the above, if four N-channel TrenchDMOS vertical power MOSFETs take an area of 4 units, then four P-channel vertical TrenchDMOS require an area 2.5·4=10. So a totem pole N-channel discrete implementation takes an area of 8 while a complementary version of discrete devices, either common source or source follower takes an area of 14, i.e. 75% more area than the N-channel discrete solution.

At a 30V breakdown rating, the integrated circuit NMOS takes an area of 16, four times the vertical device and the PMOS takes an area 4 times that of the vertical P-channel, or 4·=40. The total area of 56 in an IC is therefore 4 to 7 times that of discrete implementations. Moreover, the cost of the IC die is three times higher than the comparable area vertical device, at a relative value of 168, at least 12 times higher than using discrete TrenchDMOS vertical power MOSFETs.

When yield loss during assembly is considered, then even if the yield per die is 96% the overall yield is given by (96%)*n where n is the number of die mounted down in assembly. The yield adjusted cost is then given by Cost/Yield where * indicates the actual assembly cost is not included. Even ignoring the assembly manufacturing cost itself, the source follower solution with an effective cost of 15.2 is the second best solution. But when the actual manufacturability and through-put is considered, the effective cost and risk associated with the assembly of 5 or 6 die makes the totem pole N-channel discrete solution of FIGS. 5B and 5C unattractive. Only the two-dice complementary follower solution of FIGS. 6B and 6C combines low cost with high manufacturability.

Complementary Follower Drive Considerations

Figure 8A:
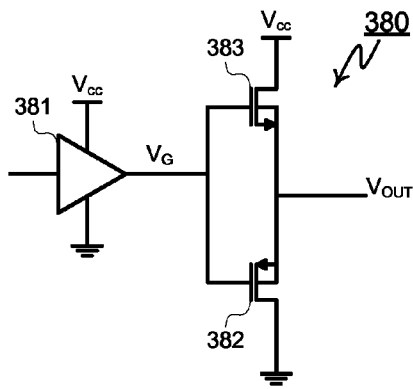
FIG. 8A is a schematic representation of a complementary follower configured half-bridge using CMOS buffer driver.
Figure 8B:
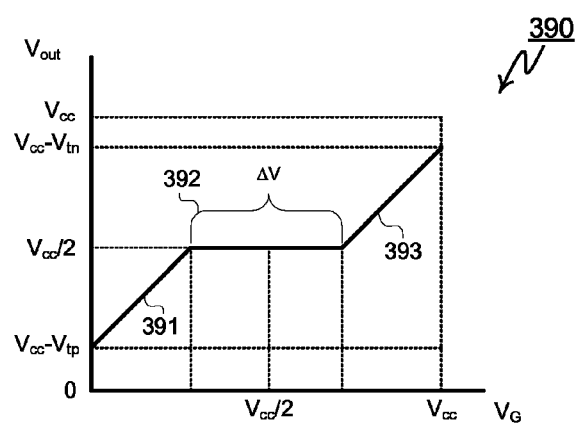
FIG. 8B is a graph showing the transfer characteristics (including built-in dead-band) of the circuit of FIG. 8A.

Driving a complementary follower for high efficiency operation in class-D audio amplification is not trivial. As shown in schematic 380 of FIG. 8A, using a simple CMOS buffer to drive the gates of the complementary follower comprising N-channel high-side MOSFET 383 and P-channel low-side 382 suffers certain limitations as illustrated in FIG. 8B. Specifically, since CMOS buffer 381 can only output a voltage VG ranging front $V_{cc}$ to 0, the follower can at best only "follow" this voltage within a threshold voltage $V_t$.

Specifically as shown in graph 390 the output of the follower has a maximum output voltage equal to ($V_{cc}-V_{tn}$) as shown by curve 393. For any output higher than that, N-channel high-side 383 turns off and can no longer source current. Similarly, curve 391 reveals that when VG is zero volts, P-channel MOSFET 382 can only sink currents for output voltages down to its threshold voltage $V_{tp}$. Beyond the P-channel devices turns off.

Since circuit 380 cannot swing rail-to-rail is suffers from poor efficiency. What is needed is gate drive circuitry which operates beyond the supply rails, i.e. below ground and above $V_{cc}$. Such circuitry will support full rail-to-rail switching in the power complementary follower output stage.

Another characteristics of complementary follower circuit 380 is its dead-band around the input and output voltage of $V_{cc}/2$. In this narrow range $\Delta V$ neither transistor is on or conducting current, so that the output $V_{out}$ can neither sink nor source current. The width of the dead-band is equal to the sum of the threshold voltages ($V_{tn}+V_{tp}$). While shoot-through protection is needed, too wide of a dead-band is detrimental to smoothly modulating a wide range of PWM duty factors.

Figure 9A:
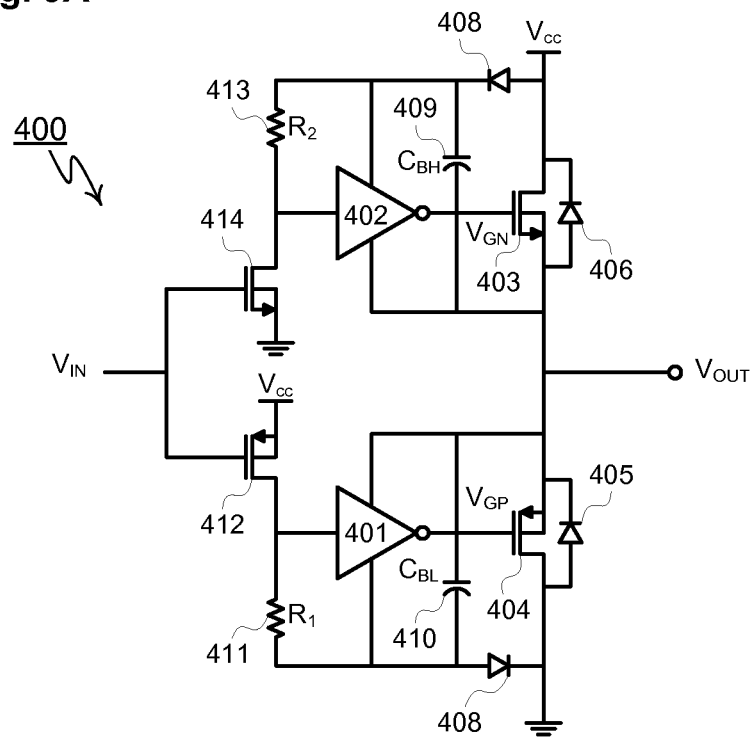
FIG. 9A is a schematic representation of a complementary follower configured half-bridge using complementary boot-strap driver.

One remedy to the dead-band and maximum-minimum common-mode range limitations of circuit 380 is illustrated in FIG. 9A. In schematic 400, a complementary boot-strap power supply is implemented to drive the gate voltage $V_{GN}$ above $V_{cc}$ and in other circumstances to drive the gate voltage $V_{GP}$ below GND. As shown floating gate buffer 402 drives gate $V_{GN}$ of N-channel source follower MOSFET 403 to a voltage of $V_{GN}=V_{BH}+V_{OUT}=(V_{ee}-V_f)+V_{out}$ for a corresponding gate to source voltage of $V_{GSN}=V_{BH}=(V_{ee}-V_f)$.

This relation can be understood by considering when low-side MOSFET 404 is on and $V_{out}=0$. During such time bootstrap diode 408 forward biases and charges bootstrap capacitor 409 to a voltage one diode drop $V_f$ less than the supply $V_{cc}$. This capacitor in turn powers floating buffer 412 to drive the gate of N-channel follower 403 to a voltage $V_{BH}$ above its source and turns on MOSFET 403. The signal input to buffer 412 is illustrated, using a resistive level shift technique with N-channel 414 and resistor 413. When $V_{out}=V_{cc}$ the gate voltage $V_{GN}$ is biased at approximately $V_{out}+V_{BH}$, which is higher than the supply voltage $V_{cc}$. For this reason $V_{out}$ can source current for all output voltages up to $V_{cc}$.

Conversely, when N-channel MOSFET 403 is on, low-side MOSFET 404 is off and $V_{out}=V_{cc}$, then diode 407 forward biases and charges capacitor 410 to a voltage $V_{BL}$ where $$V_{GP}=B_{out}-V_{BL}=V_{out}-(V_{ee}-V_f)$$

for a corresponding gate to source voltage of $$V_{GSP}=V_{BL}=-(V_{ee}-V_f)$$

Low-side bootstrap capacitor 410 then powers floating, gate buffer 401 to drive the gate of MOSFET 404 below ground so that P-channel follower 404 can continue to sink current for output voltages $V_{out}$ all the way down to ground potential. Buffer 401 is turned on and off by the gate signals Vin driving a negative level shift circuit comprising P-channel 412 and resistor 411. This signal is opposite in polarity to the signal turning on high-side buffer 412 and MOSFET 403.

Figure 9B:
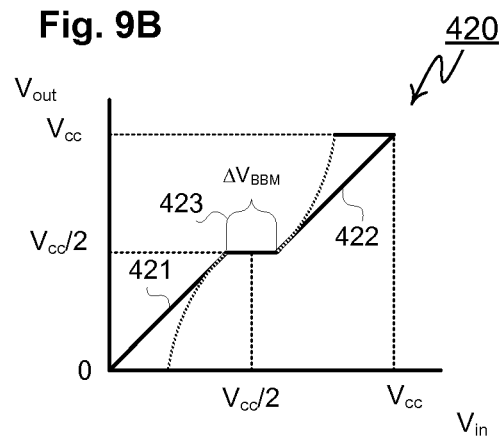
FIG. 9B is a graph showing the transfer characteristics (including adjustable dead-band) of the circuit of FIG. 9A.
Figure 9C:
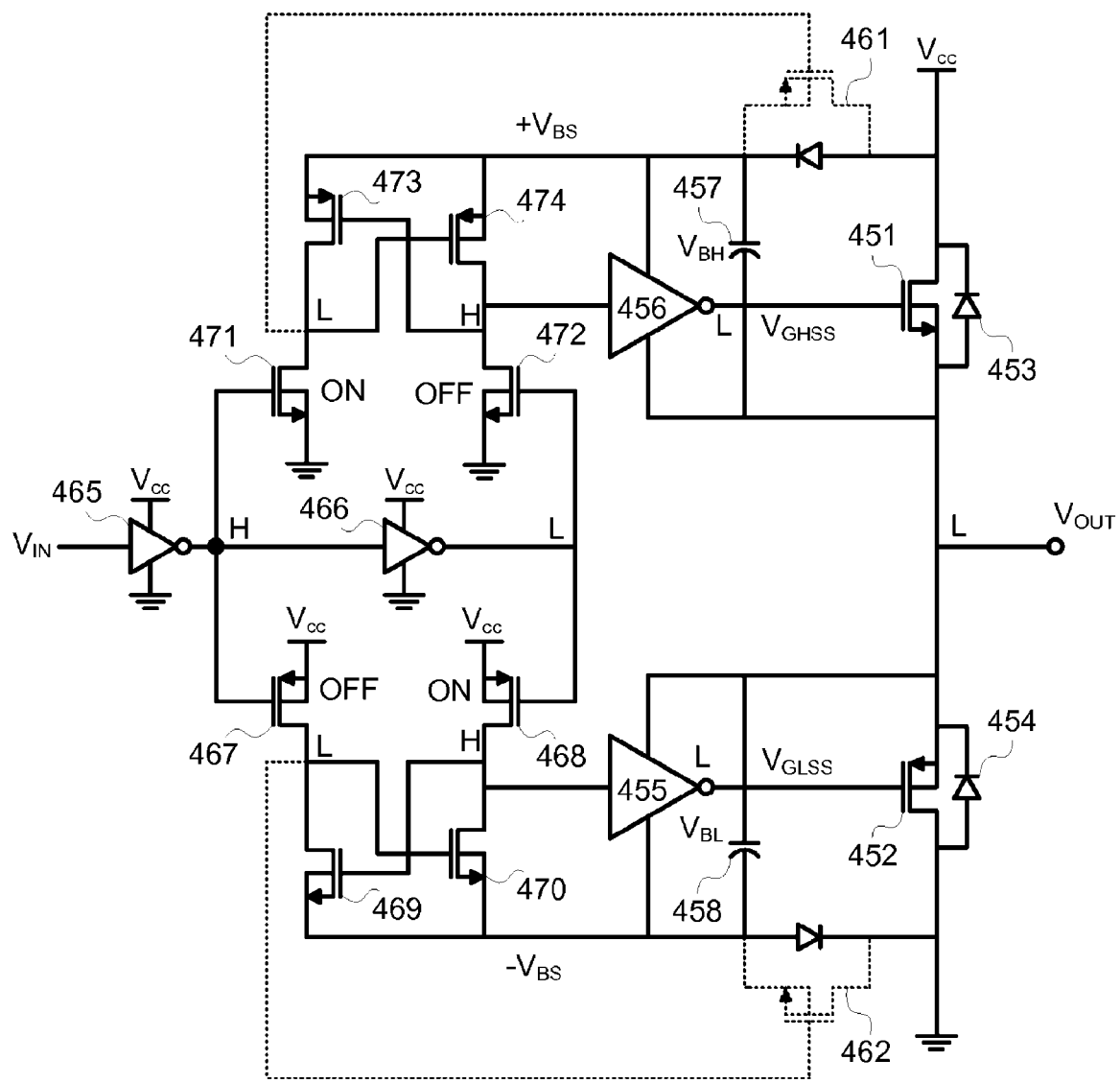
FIG. 9C is a schematic showing an implementation of the circuit of 9A modified to include improved level shift and synchronous boot-strap diodes.

The transfer characteristic of the complementary follower with complementary bootstrap drive is illustrated in graph 420 of FIG. 9B where the output may swing from ground to $V_{cc}$ without any offset voltage. By controlling the resistor values $R_1$ and $R_2$, the break-before-make dead-band $\Delta V_{BBM}$ can be adjusted as can the shape of the curve. As shown, the circuit's current-sinking capability ranges between curves 421 and 424 while its current sourcing capability extends between curves 422 and 425.

Notice that by employing two bootstrap capacitors, capacitor 409 on the high side, and capacitor 410 on the low side the output power MOSFETs 403 and 404 can be made to source and sink current on the output pin $V_{out}$ from rail-to-rail, i.e. from $V_{cc}$ to ground. The inventive complementary bootstrap drive circuit 400 does however require two bootstrap capacitors, generally connected external to the driver circuit. The extra pins needed to connect these capacitors, however, can result in package pin limitations.

Another disadvantage of level shifting and complementary bootstrap driver 400 is that either resistor 413 or 411 burns power while it conducts current, even in its quiescent state. One improvement on this level shift circuit is to replace the resistors with cross coupled latch circuits which only consume power only during transitions, and not under quiescent states. Circuit 450 illustrates an improved complementary bootstrap circuit using NMOS level shift transistors 471 and 472 driven out of phase to set a latch comprising cross coupled PMOS 473 and 474, the output of which powers floating CMOS gate buffer 456 which in turn drives the gate of N-channel follower 451.

Bootstrap capacitor 457 is charged to a voltage $V_{BH}$ whenever $V_{out}$ is at ground, i.e. when P-channel 452 is on and N-channel 451 is off. The capacitor is charged to a voltage $V_{GSHSS}=V_{BH}-V_{out}=(V_{ee}-V_f)$ through diode 459. The diode drop $V_f$ can be eliminated by including P-channel MOSFET 461 which conducts whenever capacitor 457 is being charged, so that $V_{GSHSS}=V_{BH}-V_{out}\approx V_{cc}$.

The negative going bootstrap circuit operates in a similar manner to the positive floating gate drive. As shown in 450. PMOS level shift transistors 467 and 468 are driven out of phase to set a latch comprising cross coupled NMOS 469 and 470, the output of which powers floating CMOS gate buffer 455 which in turn drives the gate of P-channel follower 452. Bootstrap capacitor 458 is charged to a voltage $-V_{BL}$ whenever $-V_{BL}$ is at $V_{cc}$, i.e. when N-channel 451 is on and P-channel 452 is off. The capacitor is charged to a voltage $V_{GSLSS}=V_{out}-V_{BH}=-(V_{ee}-V_f)$ through diode 460. The diode drop $V_f$ can be eliminated by including N-channel MOSFET 462 which conducts whenever capacitor 458 is being charged, so that $V_{GSLSS}=V_{out}-V_{BH}\approx -V_{cc}$.

Figure 10:
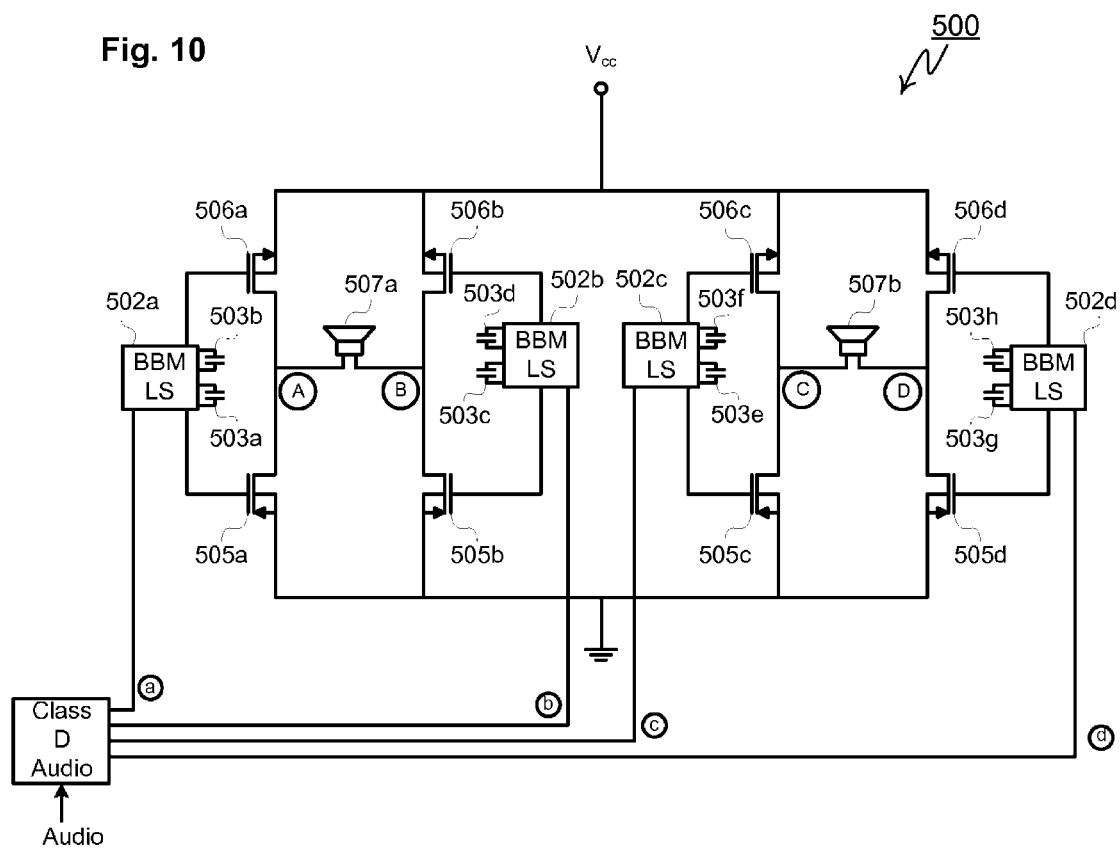
FIG. 10 is a schematic representation of a class-D stereo amplifier using complementary follower outputs with dedicated complementary boot-strap drive.

Complementary bootstrap drive is self-biasing, meaning that each half-bridge alternatively charges and discharges its bootstrap capacitors during every switching cycle in order to drive its high-side N-channel gate above $V_{cc}$ and its low-side P-channel gate below ground. The disadvantage of this approach is that every half-bridge requires two bootstrap capacitors. This limitation is shown in schematic 500 of FIG. 10 where break-before-make level shift and complementary bootstrap driver requires bootstrap capacitors 503A and 503B to properly drive N-channel high-side follower 506A and grounded P-channel follower 505A.

Similarly BBM buffer 502B with capacitors 503C and 503D powers power MOSFETs 505B and 506B, BBM buffer 502C with capacitors 503E and 503F powers power MOSFETs 505C and 506C, and BBM buffer 502C with capacitors 503G and 503H powers power MOSFETs 505D and 506D, all under the control of class D audio digital controller 501. Logic level PWM signals a, b, c and d are therefore translated into high current capable power outputs A, B, C, and D.

Figure 11:
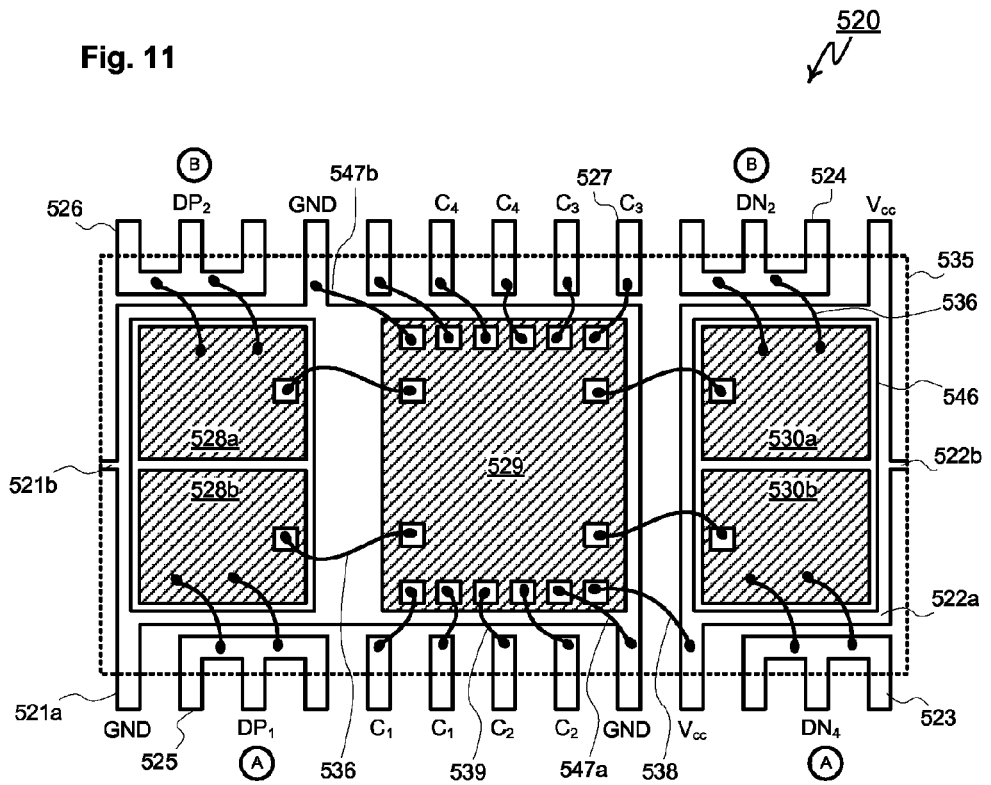
FIG. 11 is a plan view of lead-frame and triple-die implementation of an H-bridge complementary speaker driver for class-D audio applications.

The pin-out limitation becomes evident in FIG. 11 illustrating, leadframe and package assembly plan view 520 for just a single H-bridge speaker driver, including driver integrated circuit 529 and P-channel vertical trench power MOSFET die 545 both sharing the same grounded die pad 521A, and N-channel vertical power MOSFET die 546 mounted on a separate $V_{cc}$-connected leadframe 522A. Individual MOSFET drain connections are made using gold or aluminum bond wires 536 to F-shaped or T-shaped package leads 523, 524, 525 and 526. Gate connection to the individual vertical power MOSFETs is made between controller 529. P-channels 528A and 528B, and N-channels 530A and 530B using chip-to-chip wire bonds 537. Die 529 also has a wire bond 538 connecting, it to the $V_{cc}$ pin connected to die pad 522A and other bond wires 547A and 547B connected to its grounded die pad 521A. Still other bond wires 539 connect integrated circuit 529 to individual pins 527. Specifically 8 pins are dedicated to bootstrap capacitors. Depending on the layout four these pins may be eliminated since the bootstrap capacitor normally has one of its terminals hard wired to the $V_{out}$ connection A or B. Clearly the bonding diagram can be problematic with so many connections.

A preferred embodiment of this invention eliminates the majority of these bootstrap capacitors by sharing, a dual polarity bias supply for powering the gate driver circuitry.

Dual Polarity Bias Supply for Complementary Drive

An alternative to dedicated floating bootstrap drive for each half-bridge is to share a dual polarity bias supply for powering the gate buffer circuitry. This method is illustrated in schematic 550 of FIG. 12A where DC/DC converter 552 converts battery 551 to two gate bias power supplies $+V_{dd}$ and $-V_{ee}$ where $+V_{dd} > V_{ee}$, and $-V_{ee} < 0$. The output of the dual bias supply is filtered and charge stored on capacitors 554 and 553 to accommodate transient current demands.

Gate buffer 536A, powered by $+V_{dd}$ and $-V_{ee}$ bias supplies, drives N-channel high-side MOSFET 569A and P-channel low-side 567A. Similarly gate buffer 536B powers N-channel 569B and P-channel 567B, gate buffer 536C powers N-channel 569C and P-channel 567C, and gate buffer 536D powers N-channel 569D and P-channel 567D. This approach eliminates the bootstrap capacitors on each half-bridge, and requires only two reservoir capacitors 554 and 553 for the entire class D stereo system. Circuit 550 does, however, require DC/DC converter 552 to generate the dual polarity bias supplies $+V_{dd}$ and $V_{ee}$ and needed for powering the gate buffers.

Gate buffers 526A through 536D convert logic signals, a, b, c, and d into power outputs A, B, C and D by facilitating level shifting to drive the gates of source-follower MOSFETs 567 and 569 with gate voltages extending above the $V_{ee}$ supply range and below ground. One such level shifting circuit 600 illustrated in FIG. 126 comprises two resistive level shift circuits. As shown, the logic input signal drives inverters 608 and 607. Inverter 608 in turn drives the gate of NMOS 606 controlling the current in resistor 605 powered by bias supply $+V_{dd}$. This current sets the voltage $V_{GN}$ used to control, conduction in N-channel high-side source follower 602. A logic high input denoted by the small letter "H" in schematic 600 is inverted, by gate 608 to a logic low and thereby turns off NMOS 606. With NMOS 606 off, resistor 605 pulls up the gate of N-channel DMOS 602 to a voltage $V_{GN}$. The voltage $V_{GN}$ is greater than $V_{ee}$ and as high as $+V_{dd}$. Allowing $V_{out}$ to source current even for outputs as high as $V_{ee}$.

At the same time a logic "high" input is inverted by gate 607 and turns on level shift PMOS 604. The current conducting in PMOS 604 produces a voltage drop across resistor 603, pulling up the low-side MOSFET's gate voltage $V_{GP}$ to $V_{ee}$ and shutting off P-channel follower 601. With N-channel DMOS 602 conducting and P-channel DMOS 601 off, the output voltage of pin A is high, i.e. equal to $V_{ee}$.

In the opposite phase, the input is low turning NMOS 606 on and PMOS 604 off, allowing current to flow through resistor 605 which in turn drives high-side gate voltage $V_{GN}$ to ground and turns off N-channel source follower DMOS 602. Meanwhile with no current flowing through level shift PMOS 604, resistor 603 pulls the gate of low-side P-channel DMOS follower 601 down below ground to a voltage $-V_{ee}$, allowing P-channel 601 to sink current from the output even when $V_{out} = 0$.

By switching the gate voltage $V_{GN}$ of high-side N-channel. DMOS 602 between $+V_{dd}$ and ground while the gate voltage $V_{FP}$ of low-side P-channel DMOS 601 switches from to $V_{ee}$ to $-V_{ee}$, the output voltage at pin A is able to swing rail-to-rail from $+V_{ee}$ to ground.

The maximum turn-on rate for N-channel follower 602 is set by the value $R_2$ of resistor 605. The maximum turn-on rate for P-channel follower 601 is determined by the value $R_1$ of resistor 603. The size and current capability of NMOS 606 and PMOS 604 determine the turn off rate of power DMOS transistors 602 and 601.

Figure 12A:
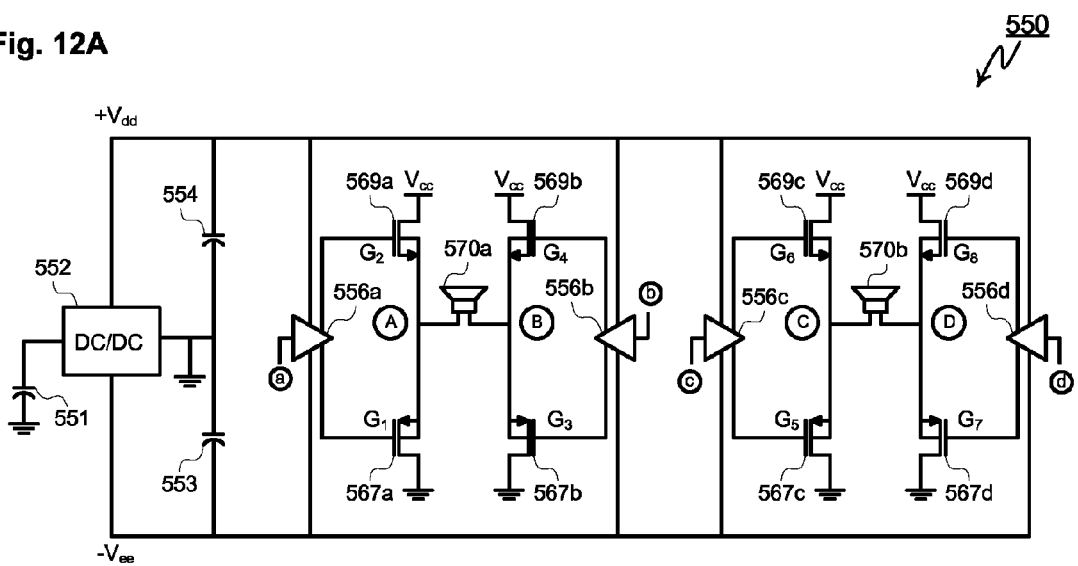
FIGS. 12A through 12C show a stereo speaker drivers for class-D audio that includes four complementary follower half-bridge outputs with dual-polarity level-shifting gate drive and shared dual-polarity bias supply.
Figure 12B:
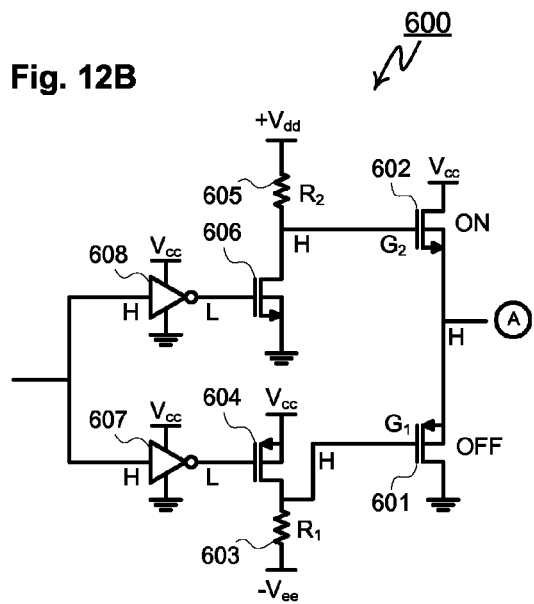
Figure 12C:
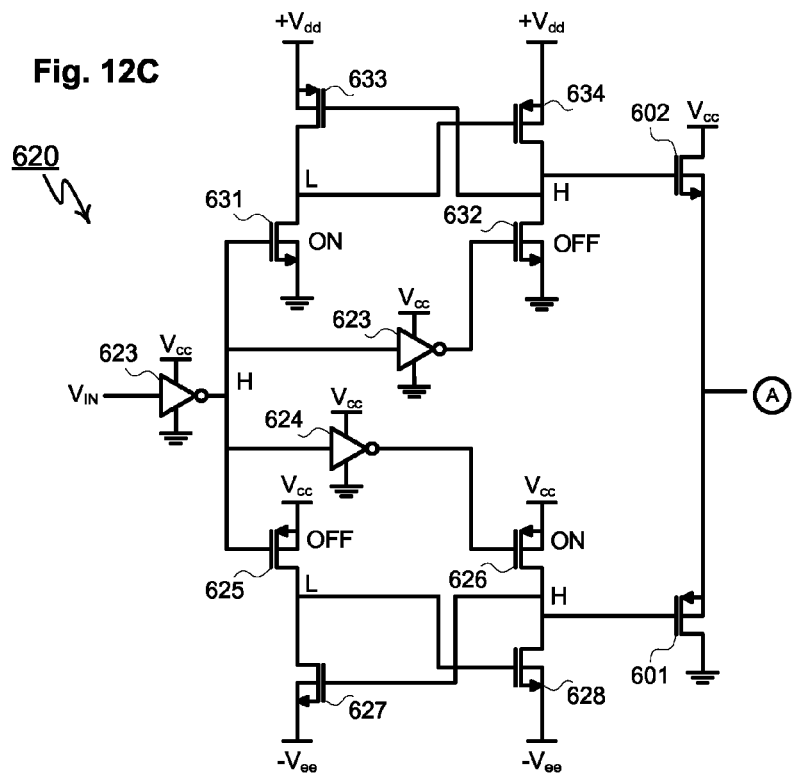

To eliminate DC quiescent current in level shift resistors 603 and 605, circuit 620 in FIG. 12C replaces the resistive level-shift circuit with a cross coupled latch circuit comprising MOSFETs 631, 632, 633 and 634 for high-side drive to N-channel follower 622 and comprising MOSFETs 625, 626, 627, and 628 for low-side drive P-channel 621. The disclosed level shift circuit provides a gate voltage $V_{GN}$ to N-channel 622 that switches between $+V_{dd}$ and ground, and a gate voltage $V_{GP}$ to P-channel 621 that switches between $+V_{ee}$ and $-V_{ee}$. The turn-on rate of MOSFETs 622 and 621 depend on the size and saturation current of $+V_{dd}$-connected PMOS 634 and $-V_{ee}$-connected NMOS 628. The turn off speed is determined by the size and resistance of grounded NMOS 632 and $V_{ee}$-connected PMOS 626.

One consideration in level-shifting gate drive circuitry for a complementary follower power half-bridge is preventing overdrive of its gates. Rapidly applying, a gate bias to a power MOST outside of the supply rail could inadvertently exceed the maximum gate voltage $V_{GS(max)}$, even briefly, and damage the power transistors gate oxide. The value of $V_{GS(max)}$ for a power MOSFET can be estimated knowing a transistor's gate oxide thickness $x_{ox}$ as per the relation $$V_{GS(max)} = (4 \text{ MV/cm}) \cdot x_{ox}$$

An intelligent gate driver which limits the instantaneous bias applied to the gates of both high-side N-channel and low-side P-channel followers is mandated. In the prior gate drivers 600 and 620, limiting gate overdrive during turn-on can only be accomplished by slowing down transitions. Voltage overshoot is controlled by limiting the current supplied by the $+V_{dd}$ and $-V_{ee}$ bias supplies to the MOSFETs' gates using, either resistors 605 and 603, or by under-sizing MOSFETs 634 and 628.

Figure 13A:
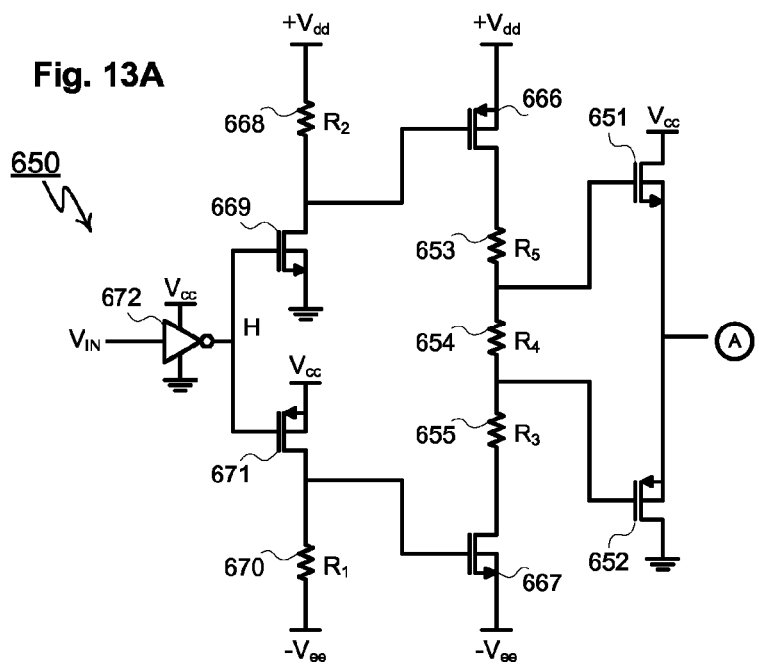
FIG. 13A is a schematic of an alternate level shift circuit with controlled crossover.
Figure 13B:
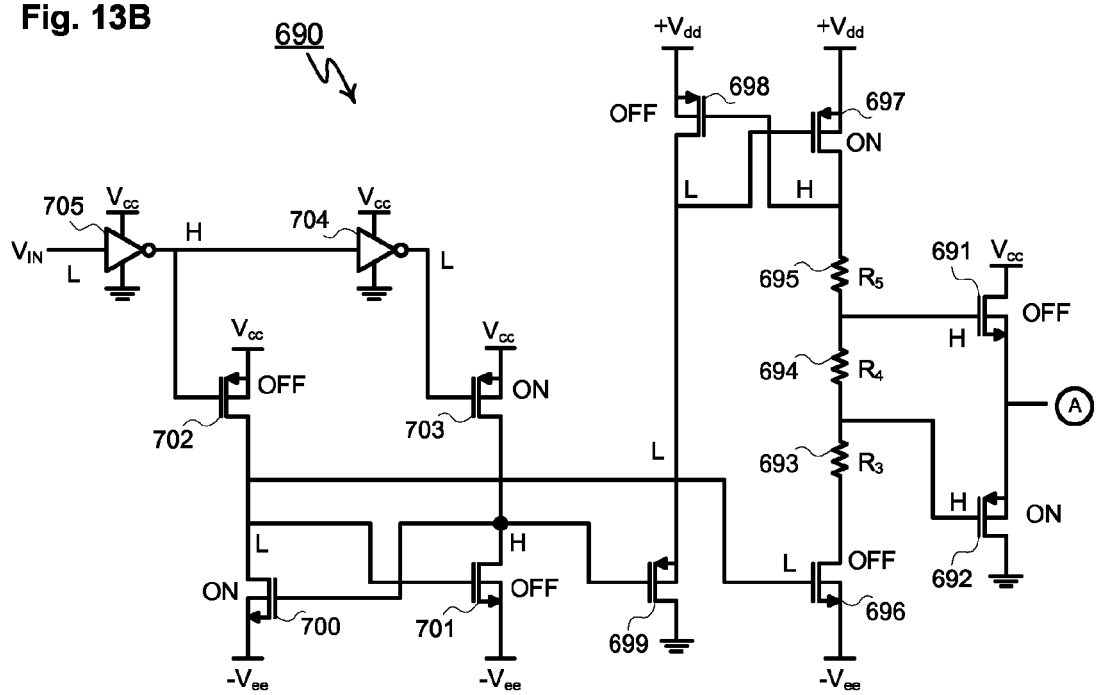
FIG. 13B is a schematic showing an improvement of the circuit of FIG. 13A.

Other methods to prevent over-voltage and voltage overshoot on the output transistors' gates are illustrated in FIGS. 13A and 13B. Specifically, circuit 650 mirrors aforementioned resistive level shift circuit 600 except that resistors 653, 654, and 655 have been included in a single level shift circuit comprising $+V_{dd}$ connected PMOS 666 and $-V_{ee}$ connected NMOS 667. Assuming PMOS 666 is switched digitally, i.e. between full on and off, the turn-on time of N-channel 651 is primarily determined by the resistance R3 of resistor 653 while the turn off of low-side MOSFET 652 is delayed by the additional resistance R4 of resistor 654. Even though the turn off is slower than turn on, shoot through does not result since there is a built-in dead-band of $(V_{in} - V_{tp})$ intrinsic to the complementary follower output circuit.

In the opposite phase, the speed of pulling the gate of low-side P-channel 652 below ground to is primarily determined by resistance R3 of resistor 655 while R4 of resistor 654 contributes to the turn-off of high side follower 651. Even though turn off of MOSFET 651 is delayed past turn on of 552, no shoot-through occurs because of the built-in dead-band intrinsic to the complementary source follower circuitry.

A similar modification to circuit 620 is shown in level shift circuit 690 of FIG. 13B with the inclusion of resistors 693, 694 and 695. Like in circuit 650, level shin 690 drives the gates of complementary follower power MOSFETs 691 and 692 with a signal ranging from $+V_{dd}$ to $-V_{ee}$, but controls the turn-off and turn-on rates to prevent damaging voltage overshoot on the MOSFETs gates.

Figure 13C:
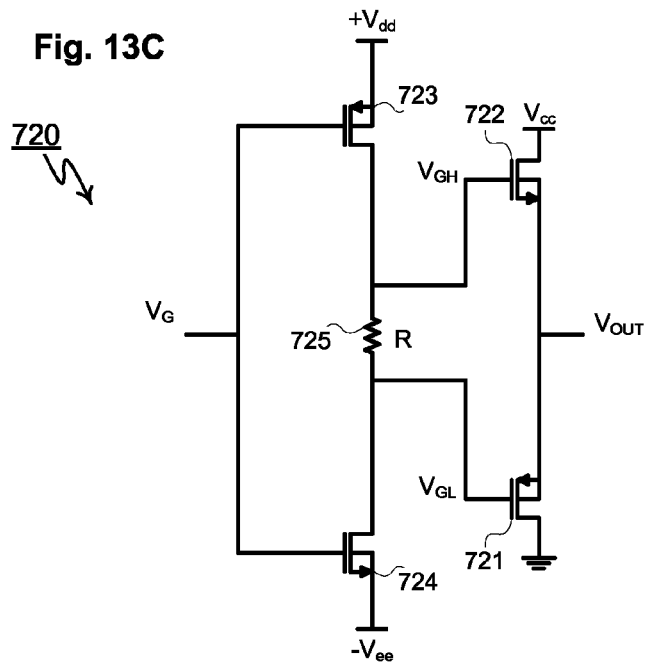
FIG. 13C is a schematic showing the circuit of FIG. 13A with simplified cross over control.

The impact of the resistors on the break-before-make (BBM) dead-band can be understood by inspecting simplified level shift circuit 720 of FIG. 13C, where an input signal VG ranges from $+V_{dd}$ to $-V_{ee}$ drives the gates of N-channel DMOS follower 722 and P-channel DMOS follower 721 with different timing for turn-on than turn off. Specifically the turn on rate of high-side MOSFET 722 is controlled by the current sourced by PMOS 723. The turn-off of 721 is delayed lagging behind in time and by a voltage offset imposed by resistor 725. As such $V_{GH}$ exceeds $V_{GL}$ during turn on of high-side MOSFET 722, delaying the turn-off of low-side follower 721 to a later time and a higher voltage and bringing the two output devices 722 and 721 closer to a shoot-though condition.

Conversely, turning-on low-side P-channel follower 721 is determined by the current sinking capability of $-V_{ee}$-connected NMOS 724 while the turn off of high-side N-channel 722 is determined by resistor 725. As such the negative transition of $V_{GL}$ leads $V_{GH}$ during turn on of low-side MOSFET 721, delaying the turn-off of high-side follower 722 to a later time and voltage a lower voltage and bringing the two output devices 721 and 722 closer to a shoot-though condition.

Figure 13D:
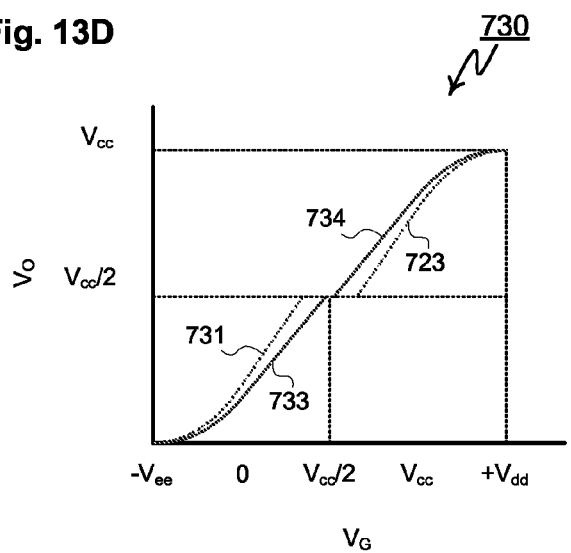
FIG. 13D is a graph showing the transfer characteristics of the circuit of FIG. 13A.

The net effect of resistor 725 is to narrow the intrinsic dead-band of the complementary follower's transfer characteristic 730 shown in FIG. 13D from normal curves 732 and 731 to a smaller dead-band behavior illustrated by curves 732 and 733. Circuit operation of 720 can be verified by considering extreme values R of resistor 725. At low resistances, where R→0, then the gates of MOSFETs 722 and 721 become shorted and $V_{GH}=V_{GL}$. As described previously, a complementary follower with a single gate voltage exhibits a dead-band of $(V_{tn}-V_{tp})$ in width, centered on the input and output voltage condition $V_{cc}/2$.

If R was chosen to be very large, i.e. R→∞), and a high voltage must be imposed on $V_{GH}$ by conducting PMOS 723 before $V_{GL}$ will start to become biased in a positive polarity, essentially making it more difficult to turn off low-side P-channel 721 and narrowing the dead-band to a value less than the sum of the thresholds $(V_{in}+V_{tp})$. Resistors 654 and 694 in level shift circuitry 650 and 690 exhibit the same effect as resistor 725 in circuit 720, except that additional resistors are added to control the source and sink currents supplied by the bias supplies $+V_{dd}$ and $-V_{ee}$.

Figure 14A:
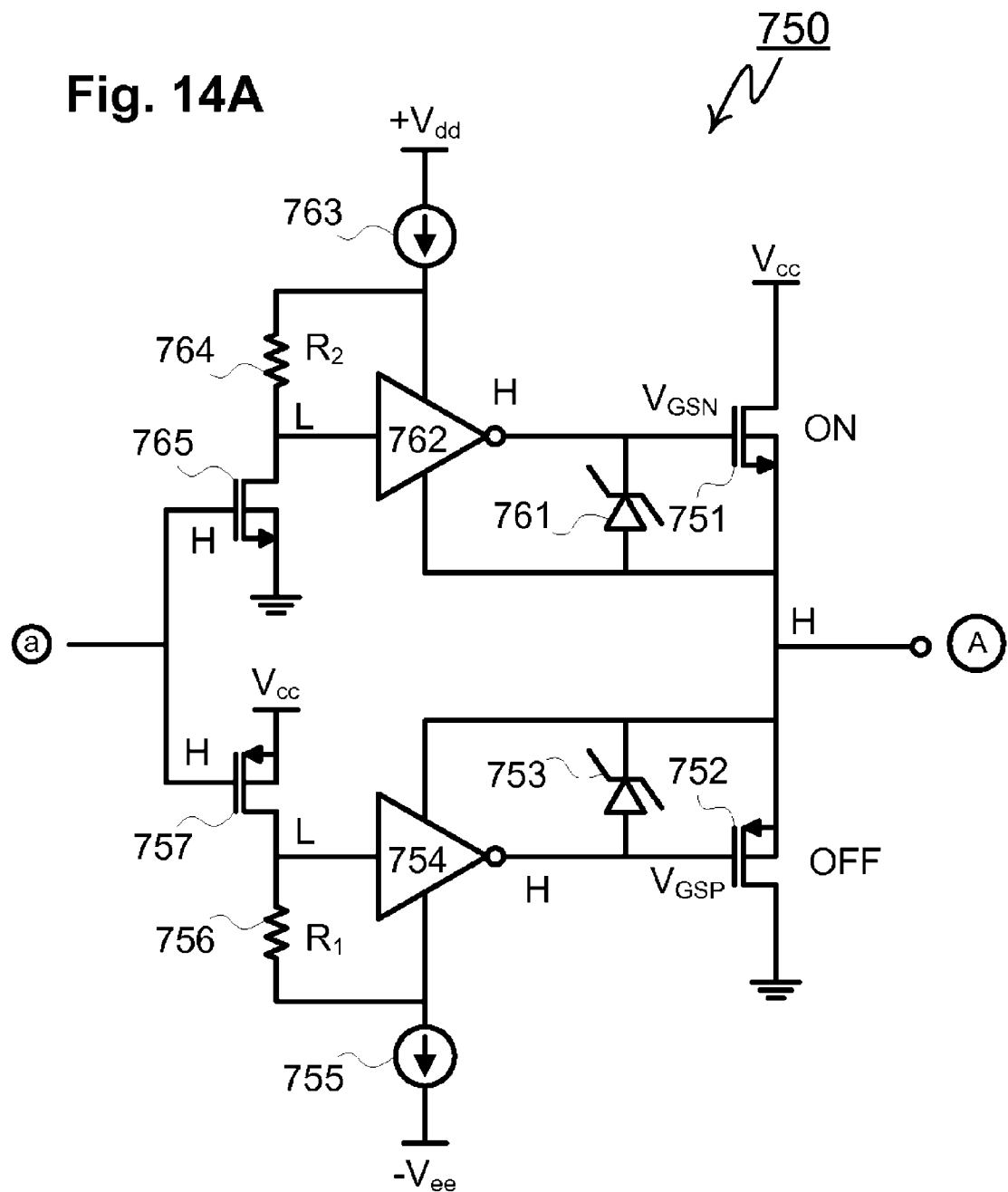
FIG. 14A is a schematic of a circuit implementing a current source level shill circuit technique.
Figure 14B:
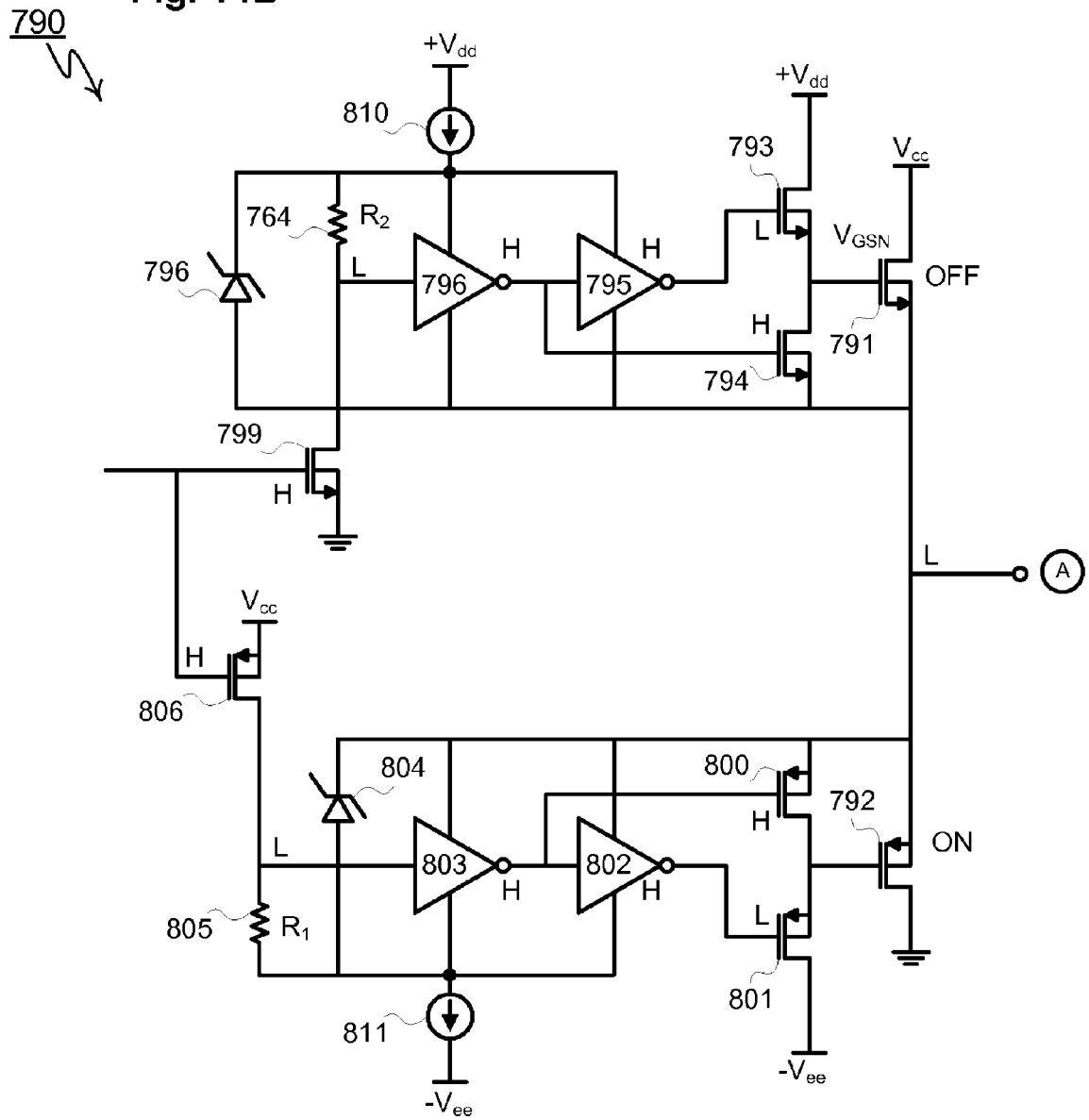
FIG. 14B is a schematic showing an improvement of the circuit of FIG. 14A.

In an alternate embodiment of level shifting gate drive circuitry in FIGS. 14A and 14B, a Zener diode acts as a shunt regulator to prevent a harmful over-voltage condition from occurring across the gate of the source follower MOSFETs. The Zener clamping action ma shunt the power MOSFETs gate-to-source connections directly or be used to limit the voltage supplied by a floating gate driver. In either case, as current limiting resistor or current source must limit the current to prevent damage in the Zener diode or shunt clamp.

In shunt regulated level shift circuit 750 of FIG. 14A for example, Zener diode 761 limits the maximum voltage $V_{GSN}$ across the gate oxide of MOSFET 751 to the Zener breakdown voltage $BV_Z$. The current supplied by the $+V_{dd}$ bias supply to CMOS gate buffer 762 and ultimately to Zener 761 is limited by current source 763. Similarly, Zener diode 753 limits the maximum voltage $V_{GSP}$ across the gate oxide of MOSFET 752 to the Zener breakdown voltage $BV_Z$. The current supplied by the $-V_{ee}$ bias supply to CMOS gate buffer 754 and ultimately to Zener 753 is likewise limited by current source 755. Alternatively Zener shunt clamp 761 can be placed across the power supply of buffer 762, and Zener clamp 753 used to clamp the supply to floating buffer 754. Aside from its Zener clamping and shunt regulation, level shift 750 operates similar to level shift circuit 600.

Another shunt regulator clamped level shift circuit is illustrated in circuit 790 of FIG. 14B. As shown Zener clamp 796 limits the voltage applied to CMOS buffers 796 and 795. The output of buffer 795 then drives the gate of source follower NMOS 793. Since a source follower cannot supply current when its source is within one threshold of its drain voltage, then follower 793 acts like a series regulator to clamp the voltage. The maximum gate drive using this method is then given by $V_{GSN} \leq BV_Z - V_{in}$ Unlike in circuit 750 where Zener 761 is a power clamp, the current limiting 810 in circuit 790 is not critical since Zener 796 only has to limit the gate bias of follower 793. Similarly Zener diode 804 clamps the voltage across inverters 803 and 802 and drives the gate of $-V_{ee}$-connected PMOS follower 801, thereby limiting the maximum $V_{GSP}$ on MOSFET 792 to a voltage of $(BV_Z - V_{tp})$. Notice the high current path for charging the gates of MOSFETs 791 and 792 flows directly from the $+V_{dd}$ and $-V_{ee}$ bias supplies through source followers 793 and 801 without the need for Zener diodes 796 and 804 and current sources 810 and 811 to carry high currents. Aside from its Zener clamping and shunt regulation, level shift 790 operates similar to level shift circuit 620.

Figure 15:
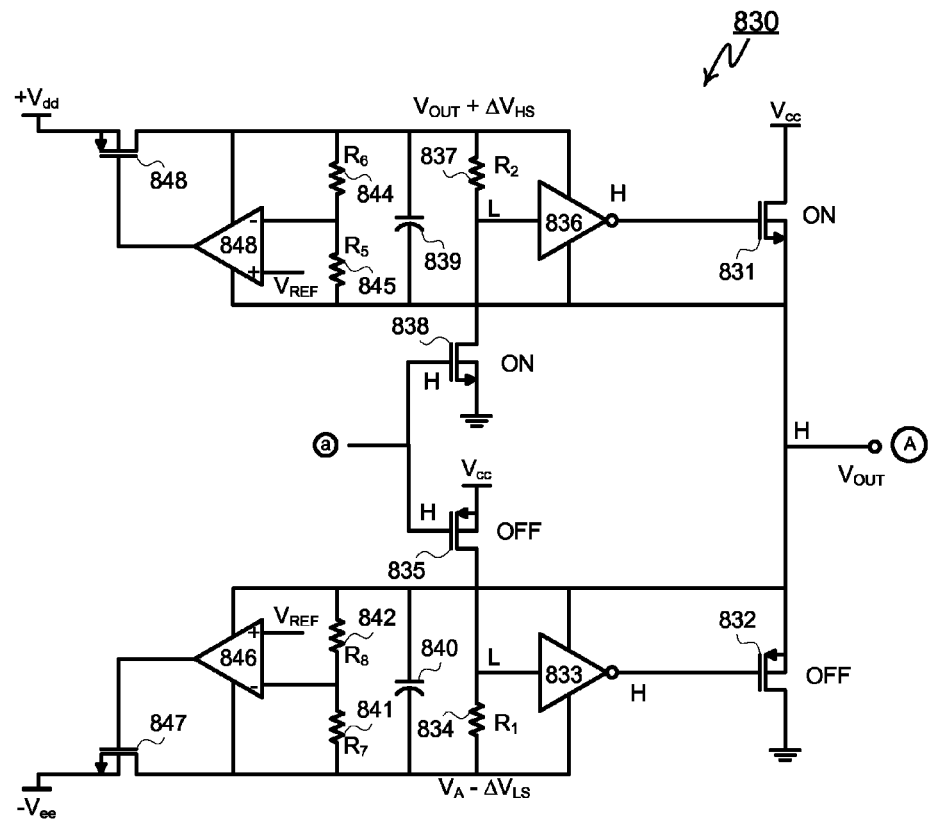
FIG. 15 is a floating LDO level shift circuit schematic.

FIG. 15 illustrates another embodiment of a voltage clamped level shifting gate drive circuit suitable for complementary follower half-bridge circuits. In circuit 830, series pass regulation, rather than shunt regulation or Zener clamping, is used to protect the gates of complementary follower power MOSFETs 831 and 832. As such, gate buffer 836 driving the gate of N-channel high-side follower 831 is powered from the output of a floating linear regulator circuit comprising PMOS pass element 848 controlled by amplifier 845. Feedback of the linear regulators output voltage across capacitor 839 is adjusted by resistor divider 843 and 844 and compared to floating voltage reference $V_{ref}$ hereby limiting the maximum voltage applied to CMOS buffer 836 to a potential safe for the gate oxide of N-channel DMOS 831. Since the linear regulator is referenced to the source of MOSFET 831, the entire circuit floats with the output. The voltage differential between $+V_{dd}$ and the floating voltage $V_{out}+\Delta V_{HS}$ is dropped across the drain-to-source terminals of PMOS 848. NMOS 838 and resistor 837 provide the level-shifted gate signal to buffer 836.

In a symmetrical circuit, gate buffer 833 driving the gate of P-channel low-side follower 832 is powered from the output of a floating linear regulator circuit comprising NMOS pass element 847 controlled by amplifier 846. Feedback of the linear regulators output voltage across capacitor 840 is adjusted by resistor divider 841 and 842 and compared to floating voltage reference $V_{ref}$ thereby limiting the maximum voltage applied to CMOS buffer 833 to a potential safe for the gate oxide of N-channel DMOS 832. Since the linear regulator is referenced to the source of MOSFET 832, the entire circuit floats with the output. The voltage differential between $-V_{ee}$ and the floating voltage $V_{out}-\Delta V_{LS}$ is dropped across the drain-to-source terminals of NMOS 847, PMOS 835 and resistor 834 provide the negative level-shifted gate signal to buffer 833.

Dual Polarity Bias Supplies

Referring again to class D audio amplifier 550 of FIG. 12A, DC/DC converter block 552 must generate the bias supplies $+V_{dd}$ and $-V_{ee}$ to power gate buffers 556A through 556D. Both bias supplies are outside the range of the batter or power supply input, where $+V_{dd} > V_{ee}$ and $-V_{ee} < 0$. Generating these dual polarity power supply rails from a unipolar voltage input or battery is the subject of related patent applications and is included herein for completeness.

Figure 16:
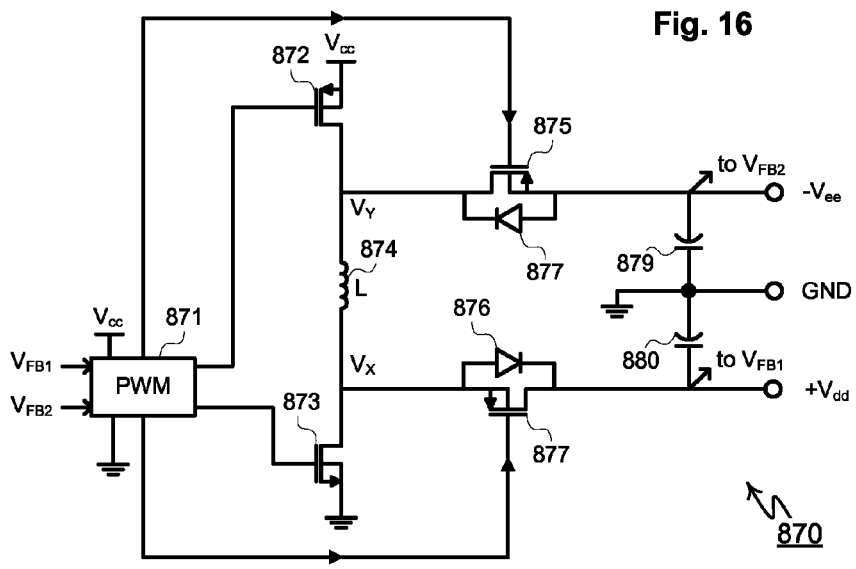
FIG. 16 is a schematic of a switched inductor bias supply for dual-polarity level-shifting gate drive.

Dual-Polarity Switched Inductor Regulator:

Specifically, FIG. 16 illustrates a switched inductor bias supply as described in U.S. Published Patent Application No. 200910039711, entitled "Dual-Polarity Multi-Output DC/DC Converters and Voltage Regulators" by R. K. Williams for generating a positive and a negative supply voltage using a switching regulator comprising a single inductor, which is incorporated herein by reference. As shown PWM switching regulator 870 comprises a PWM controller 871 with high-side P-channel power MOSFET 872 and low-side N-channel 873, inductor 874 and two synchronous-rectifier MOSFETs 875 and 877 with intrinsic P-N diodes 876 and 877. While synchronous rectifier MOSFET 877 is shown as a P-channel, an N-channel device may be used in its place with appropriate adjustments in the polarity of gate drive signals.

The converter outputs two supply voltages, one positive $+V_{dd}$ and another negative $-V_{ee}$, both filtered by output capacitors 879 and 880.

Operation of DC/DC converter involves using pulse width modulation or variable frequency techniques to control and regulate two outputs $-V_{ee}$ and $+V_{dd}$. Operation involves turning on PMOS 872 and NMOS 873 simultaneously for a time ton and building up current, i.e. magnetizing, inductor 874. During that time $V_x$ is biased near ground at a voltage equal to $IL \cdot R_{DSN}$, the inductor current IL times the on-resistance $R_{DSN}$ of NMOS power transistor 873. At the same time, $V_y$ is biased to a voltage nearly that of the converter's input $V_{ee}$, namely $(V_{ee} - I_L \cdot R_{DSP})$ where $R_{DSP}$ is the on-resistance of PMOS power MOSFET 872. During this cycle both synchronous rectifiers 875 and 877 remain off. Assuming capacitor 879 is charged to a below ground voltage $-V_{ee}$ and capacitor 880 is charged to a positive voltage $+V_{dd} > V_{ee}$, the intrinsic P-N diodes 876 and 877 remain reverse biased during this interval.

In the second phase of operation PMOS 872 and NMOS 873 are both shut off in which case voltage $V_x$ immediately flies up to a positive voltage above both $V_{ee}$ and $+V_{dd}$ and forward biases diode 878. The positive transient is clamped at a voltage $V_x$ equal to $(+V_{dd}+V_f)$, transferring energy from inductor 874 into capacitor 880. The voltage $V_f$ is the forward bias voltage of P-N diode 878. In tandem with $V_x$ flying high, $V_y$ simultaneously flies negative to a below ground potential. The negative going transient is clamped to a negative voltage $V_y=(V_{ee}-V_f)$, transferring energy from inductor 874 into capacitor 879 through forward biased diode 876. In this case, the voltage $V_f$ is the forward bias voltage of P-N diode 876. For simplicity's sake, the forward drop $V_f$ can be approximated to be the same drop across diode 878 and 876 since they are carrying similar currents.

Subsequent to turning MOSFETs 872 and 873 off, and after a minimum break-before-make (BBM) interval tBBM, synchronous rectifier MOSFETs 875 and 878 are turned on and shunt the current flowing, in diodes 876 and 878, during which time $V_x=V_{dd}+I_L \cdot R_{DSP}$ and $V_y=V_{ee}-I_L \cdot R_{DSN}$.

The MOSFETs remain in this condition until the voltages across capacitors 879 and 880 reach their nominal value as determined by PWM controller 871 responding to feedback signals $V_{FB2}$ and $V_{FB1}$ monitoring the $-V_{ee}$ and $+V_{dd}$ outputs. When $+V_{dd}$ reaches its nominal value synchronous rectifier MOSFET 877 is turned off and after as break-before-make interval $t_{BBM}$, NMOS 873 is turned back on driving $V_x$ to a voltage near ground and reverse biasing diode 878. Meanwhile inductor 874 continues to transfer energy into capacitor 879.

When $-V_{ee}$ finally reaches its nominal value synchronous rectifier MOSFET 875 is turned off and after a break-before-make interval $t_{BBM}$. PMOS 872 is turned back on driving $V_y$ to a voltage near $V_{ee}$ and reverse biasing diode 876. Once both PMOS 872 and NMOS 873 are both conducting current in inductor 874 begins to build up again, replenishing energy lost to output capacitors 879 and 880 and starting the cycle again.

In the sequence described $V_{dd}$ reached its final value before in such case the converter 870 continued to supply power to $-V_{ee}$ and capacitor 879 for a longer duration than to capacitor 880. In the contrary case if $-V_{ee}$ reaches its target value sooner than $+V_{dd}$, then the sequence can reverse where first synchronous rectifier 875 is turned off and then PMOS 872 is turned on, driving $V_y$ up to a voltage near $V_{ee}$ and reverse biasing diode 876. During this time current can continue to flow through synchronous rectifier 877 into capacitor 880 and output $+V_{dd}$. Later when $+V_{dd}$ reaches it target value synchronous rectifier 873 is turned, off and a $t_{BBM}$ interval later NMOS 873 is turned on, once again reenergizing inductor 874.

In steady state, duty factor control requires the energy put in to inductor 874 must be equal to the amount removed during the time when NMOS 873, PMOS 872 or both are oil. Since either NMOS 873 or PMOS 872 can be switched independently, the control of energy transfer from inductor 874 to capacitor 979 and to capacitor 880 is independently controllable.

In an alternative embodiment the synchronous rectifier timing can be alternated with magnetizing the inductor, i.e. alternating magnetizing, transferring energy into the $+V_{dd}$ output capacitor, magnetizing the inductor again, transferring energy into the $-V_{ee}$ output capacitor and repeating the cycle, in detail, operation commences by turning on both PMOS 872 and 873 to magnetize inductor 874, then after a time ton1, turning off NMOS 873. After a delay $t_{BBM}$, synchronous rectifier 877 is turned on till $V_{dd}$ its target value. Next synchronous rectifier 877 is shut off and after NMOS 873 is again turned on, thereby magnetizing inductor 874 for a time $t_{on2}$.

In the next phase PMOS 872 is turned off, and after $t_{BBM}$ synchronous rectifier 875 is turned on transferring energy to capacitor 879 and to the $-V_{ee}$ output. After $-V_{ee}$ reaches its target value synchronous rectifier 875 is turned off and after a time $t_{BBM}$. PMOS 872 is turned on, once again magnetizing inductor 874. In this way interval ton1 replenishes the energy lost to the $-V_{ee}$ output and $t_{on2}$ replenishes the energy lost to the $+V_{dd}$ output, allowing nearly independent control of two regulated outputs from a single inductor.

In converter 870, the synchronous rectifiers may be switched digitally, between off i.e. with no current, to "on" with the device's lowest possible on-resistance. Alternatively the synchronous rectifier may be operated in a manner where it never turns off, but always allows some current to flow through it. Operation of a saturated MOSFET where $V_{DS} > V_{GS}-Vt$ is a well known method to produce a constant current source. Synchronous rectification alternating between a low on-resistance state and a constant-current state as described in U.S. Published Patent Application No. 2008/0084197, entitled "Low-Noise DC/DC Converter With Controlled Diode Conduction" by Richard K. Williams has certain benefits in achieving low noise and improved efficiency in switching regulators and is incorporated herein by reference.

Figure 17:
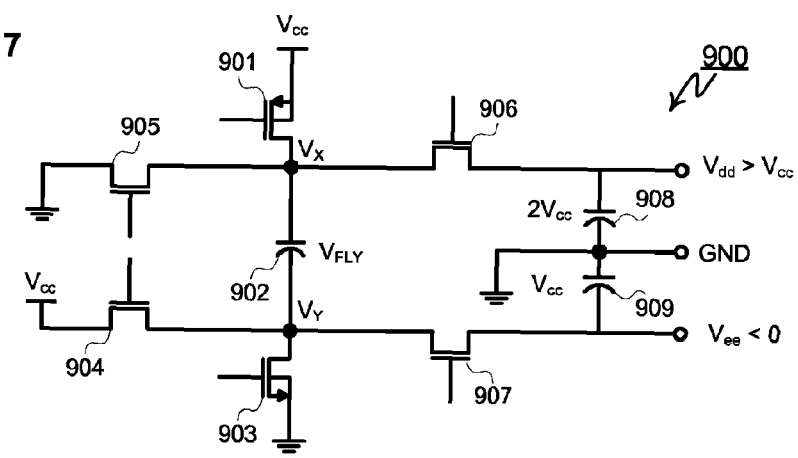
FIG. 17 is a schematic of a switched capacitor bias supply for dual-polarity level-shifting gate drive.

Dual-Polarity Switched Capacitor Bias Supply:

Specifically, FIG. 17 illustrates a switched-capacitor bias supply as described in U.S. Published Patent Application No. 2009/0039947, entitled "Time-Multiplexed-Capacitor DC/DC Converter with Multiple Outputs" by Richard K Williams for generating, a positive and a negative supply voltage using a switched capacitor network comprising a single flying capacitor, which is incorporated herein by reference. As shown in schematic 900 of FIG. 17, circuit operation involves the repeated charging and subsequent discharging of flying capacitor 902 into two reservoir capacitors 908 and 909 using a network of MOSFETs. Operating as switches for completing and breaking various circuit paths, the MOSFETs may operate digitally, i.e. having an on and off state, or by limiting current under certain circumstances.

Operation of dual polarity output charge pump circuit 900 commences with the charging of flying, capacitor 902 by turning on PMOS 901 and NMOS 903, whereby capacitor 902 charges to a voltage $V_{fly}$ approximately equal to $V_{ee}$. This condition is referred to herein as the charging phase.

Daring a first charge transfer phase. MOSFETs 901 and 903 are turned off and MOSFET 904 and 906 are turned on. By connecting the negative terminal $V_y$ of flying capacitor 902 to $V_{ee}$ through MOSFET 904, the voltage at $V_x$ immediately jumps to $(V_{ee}+V_{fly}) \approx 2 \cdot V_{ee}$ which is then transferred to capacitor 908 through conducting MOSFET 906. In steady state the output voltage $+V_{dd}$ will charge to a value approximately equal to twice the input voltage $V_{ee}$. After the first charge transfer phase MOSFETs 904 and 906 are turned off and MOSFETs 901 and 903 are turned on, replenishing the charge on flying capacitor 902, once again charging it to a voltage $V_{ee}$.

In a second charge transfer phase, MOSFETs 901 and 903 are turned off and MOSFET 905 and 907 are turned on. By connecting the positive terminal $V_x$ of flying capacitor 902 to ground through MOSFET 905, the voltage at $V_y$ immediately jumps to $(0-V_{fly}) \approx -V_{ee}$ which is then transferred to capacitor 909 through conducting MOSFET 909. In steady state the output voltage $-V_{ee}$ will charge to a value approximately equal to the negative of the input voltage $V_{ee}$.

After the second charge transfer phase MOSFETs 905 and 907 are turned off and MOSFETs 901 and 903 are turned on, replenishing the charge on flying capacitor 902, once again charging it to a voltage $V_{ee}$. The entire cycle then repeats itself.

Using either one of these methods or by using separate power supplies the bias supplies $+V_{dd}$ and $-V_{ee}$ and may be generated to power the gate buffers in class-D audio amplifiers.

Class-D Output Integral Bootstrap Supply

Figure 18A:
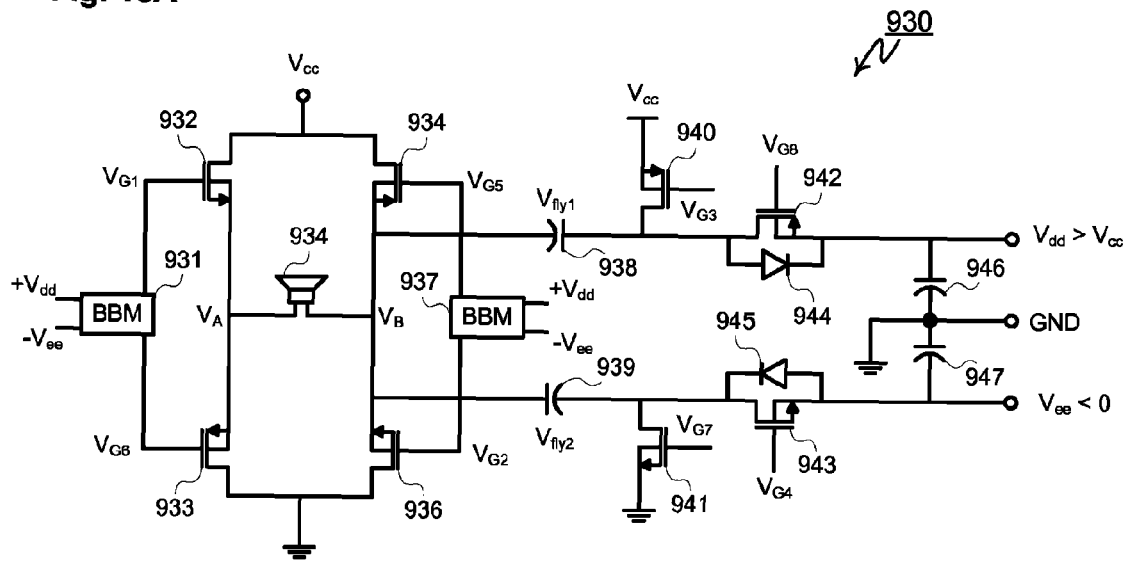
FIG. 18A is a schematic of a class-D output stage with integral bootstrap bias supply.

In an alternative embodiment of this invention the $+V_{dd}$ and $-V_{ee}$ bias supplies do not employ a dedicated DC/DC switching converter, but instead is generated from the switching action of the class-D power output stage itself. As shown in schematic 930 of FIG. 18A, a class-D output stage comprising two complementary follower half-bridge outputs drives speaker 934. One half-bridge comprises high-side N-channel vertical DMOS power MOSFET 932 and low-side P-channel vertical DMOS power MOSFET 933 driven by BBM buffer and level shifting gate driver 931. The other half-bridge comprises high-side N-channel vertical DMOS power MOSFET 934 and low-side P-channel vertical DMOS power MOSFET 936 driven by BBM buffer and level shifting gate driver 937. The two half-bridges are driven out of phase and switch continuously using PWM control to achieve class-D amplification.

Half-Bridge Bias Generator:

As shown in circuit 930, a dual polarity power supply is generated from the switching action of one half-bridge, in this case MOSFETs 934 and 936. The common source output $V_B$ of this half-bridge is AC coupled using flying capacitors 938 and 939. To generate the positive Output $+V_{dd}$, capacitor 938 is connected to the power input $V_{ee}$ through PMOS 942 and to output capacitor 946 through synchronous rectifier PMOS 942 with intrinsic P-N diode 944. To generate the negative output $-V_{ee}$, capacitor 939 is connected to ground through NMOS 941 and to output capacitor 947 through synchronous rectifier NMOS 943 with intrinsic P-N diode 945.

Figure 18B:
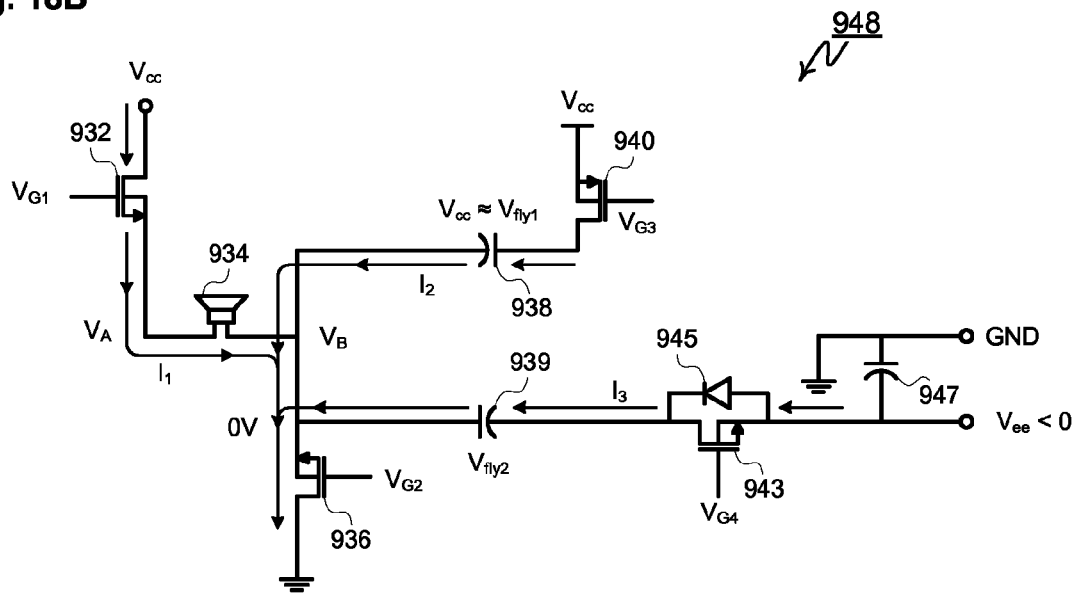
FIG. 18B shows the circuit of FIG. 18A during a negative supply charging phase.

Operation is similar to dual-polarity boot-strap gate drive 400 except that the circuit produces two bias outputs, one negative and one positive, used to power multiple gate buffers. In FIG. 18B, schematic 948 illustrates circuit 930 in one of two operating states, we refer to herein as the negative supply charging phase. With appropriate polarity gate-voltages $V_{G1}$ and $V_{G2}$, N-channel 932 and P-channel 936 power MOSFETs are turned-on, driving the voltage $V_A$ to $V_{ee}$, pulling $V_B$ to ground, and sourcing current $I_1$ through speaker 934.

During this cycle, PMOS 940 is turned on, conducting current $I_2$ and charging flying capacitor 938 to a voltage $V_{fly1}=V_{ee}$. At the same time. PMOS synchronous rectifier 943 is turned-on connecting pre-charged flying capacitor 939 to the $-V_{ee}$ output and reservoir capacitor 947. Because capacitor 939 is pre-charged from a previous phase to a voltage $V_{fly2}=V_{ee}$, connecting its negative terminal to the $-V_{ee}$ output causes current $I_3$ to flow in PMOS 943 and in forward biased P-N diode 945. Accordingly flying capacitor 939 thereby transfers charge to reservoir capacitor 947 forcing the output negative so that $(-V_{ee}) \rightarrow (-V_{ee})$.

Low-side P-channel follower 936, therefore carries the speaker current charging current $I_2$ for flying capacitor 938, and the charge transfer current $I_3$ from flying capacitor 939, reservoir capacitor 947 and any load attached to the $-V_{ee}$ bias output. P-channel power MOSFET 936 must be appropriately sized for low on-resistance. The on-resistances of MOSFETs 940 and 943 in the bias generator circuitry do not to be as low because they carry current used only to power gate buffers, not speakers.

Figure 18C:
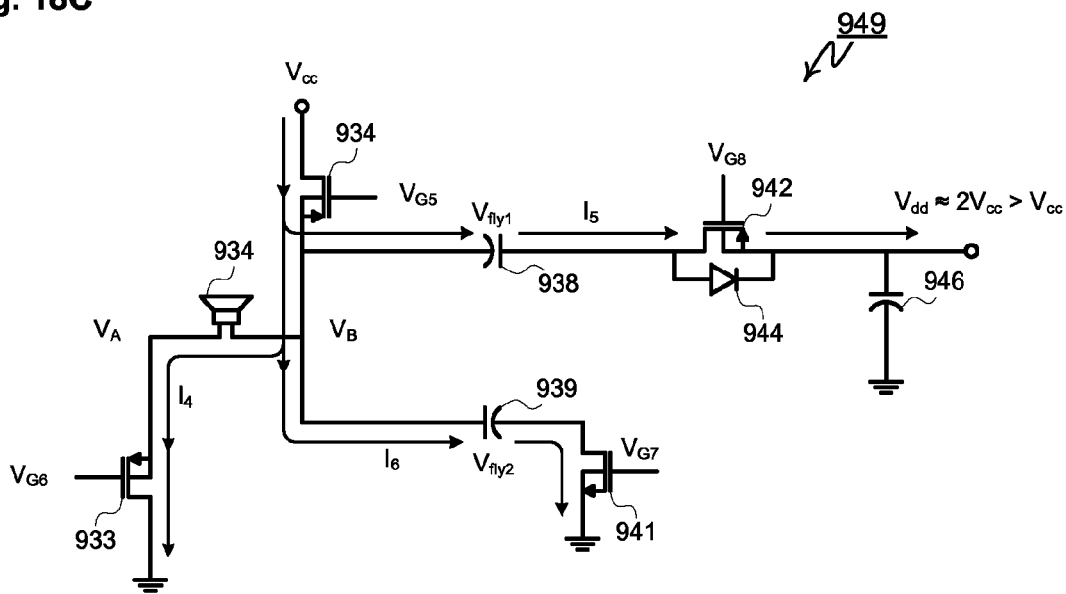
FIG. 18C shows the circuit of FIG. 18A during a positive supply charging phase.

In FIG. 18C, schematic 949 illustrates circuit 930 in the second of its two operating states referred to herein as the positive-supply charging phase. With appropriate polarity gate-voltages $V_{G5}$ and $V_{G6}$, N-channel 934 and P-channel 933 power MOSFET followers are turned-on, pulling voltage VA to ground, driving $V_B$ to $V_{ee}$, and sourcing current $I_4$ through speaker 934.

During this cycle, NMOS 941 is turned on, conducting current $I_6$ and charging flying capacitor 939 to a voltage $V_{fly2}=V_{ee}$. At the same time, synchronous rectifier 942 is turned-on connecting pre-charged flying capacitor 938 to the $+V_{dd}$ output and reservoir capacitor 946. Because capacitor 938 is pre-charged from the previous phase to a voltage $V_{fly1}=V_{ee}$, connecting its positive terminal to the $+V_{dd}$ output causes current $I_5$ to flow in MOS 942 and in forward biased P-N diode 944. Accordingly flying capacitor 938 thereby transfers charge to reservoir capacitor 946 forcing the output above $V_{ee}$ so that $(+V_{dd}) \rightarrow (+2V_{ee})$.

High-side N-channel follower 934, therefore carries the speaker current $I_4$, charging current $I_6$ for flying capacitor 939, and the charge transfer current $I_5$ from flying capacitor 938, reservoir capacitor 946 and any load attached to the $+Y_u$ bias output. N-channel power MOSFET 934 must be appropriately sized for low on-resistance. The on-resistances of MOSFETs 939 and 942 in the bias generator circuitry do not to be as low because they carry current used only to power gate buffers, not speakers.

Figure 18D:
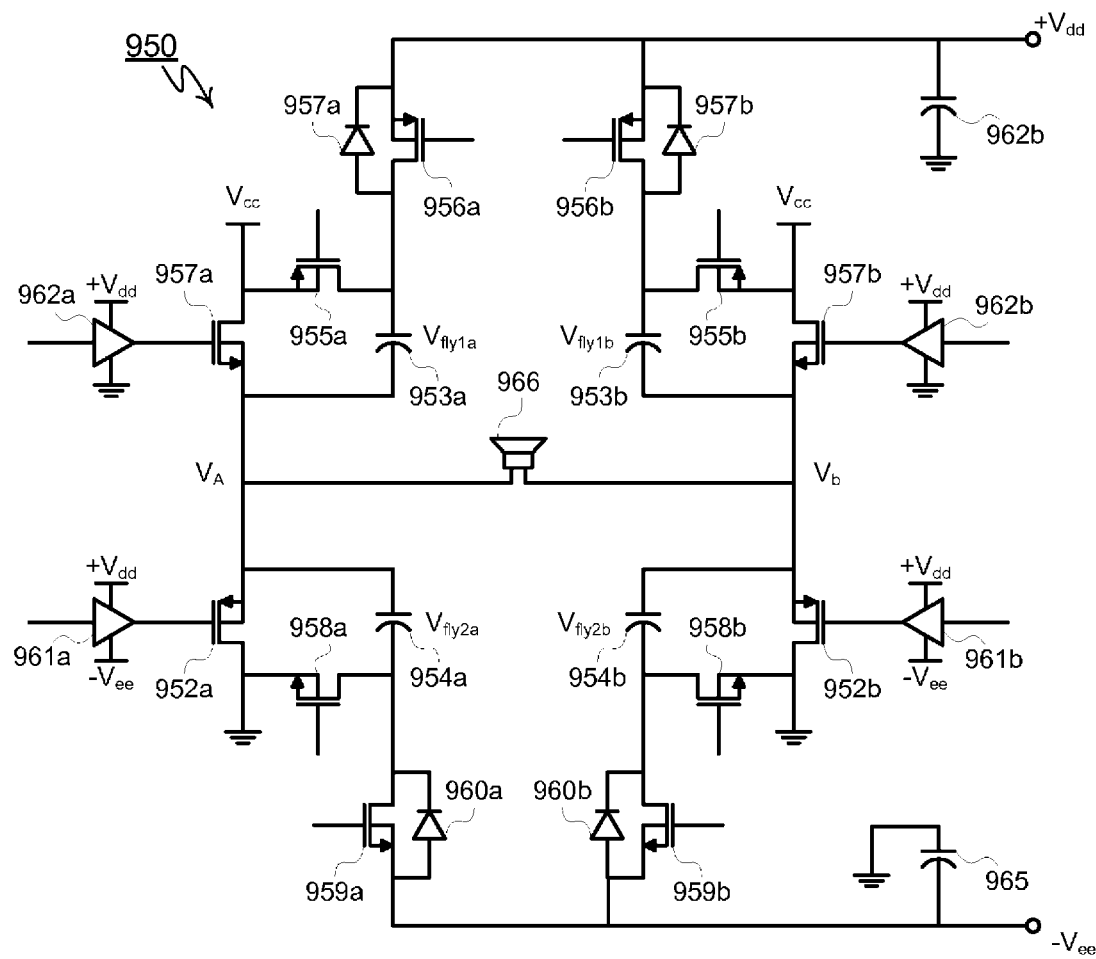
FIG. 18D is a schematic of a complementary bootstrap bias generator.

Full-Bridge Bias Generator:

Generating the $+V_{dd}$ and $-V_{ee}$ bias supplies from the switching action of a class-D audio amplifier can be achieved from any single half-bridge. Alternatively, the same technique can be used to derive power from a full bridge, i.e. from two half-bridges, as shown in FIG. 18D with less output ripple. In circuit 950, two-phase charging of $+V_{dd}$ reservoir capacitor 964 is achieved with synchronous rectifiers 956A and 956B, alternatively transferring charge from flying capacitors 953A and 953B to reservoir capacitor 964 every phase.

Specifically when $V_A$ is ground. PMOS 955A charges flying capacitor 953A, synchronous rectifier 956A is off and diode 957A is reverse biased. Meanwhile, while $V_B$ is at $V_{ee}$, PMOS 955B is off, diode 957B is forward biased and synchronous rectifier MOSFET 956B is conducting, transferring charge from flying capacitor 953B to reservoir capacitor 964 and driving $(+V_{dd}) \rightarrow 2 \cdot V_{ee}$.

Alternatively when $V_B$ is ground, PMOS 955B charges flying capacitor 953B, synchronous rectifier 956B is of and diode 957B is reverse biased. Meanwhile, while $V_A$ is at $V_{ee}$, PMOS 955A is off, diode 957A is forward biased and synchronous rectifier MOSFET 956A is conducting, transferring charge from flying capacitor 953A to reservoir capacitor 964 and also driving $(+V_{dd}) \rightarrow 2 \cdot V_{ee}$.

The net effect is that reservoir or "output" capacitor 964 of the $+V_{dd}$ positive bias supply is being charged in every switching phase similar to that of a full-wave bridge rectifier in an AC-to-DC converter. Circuit 950 operates in a similar fashion to generate a $-V_{ee}$ negative bias supply output from the switching action of the class-D amplifier where two-phase charging of $-V_{ee}$ reservoir capacitor 965 is achieved with synchronous rectifiers 959A and 959B, alternatively transferring charge from flying capacitors 954A and 954B to reservoir capacitor 965 every phase.

Specifically when $V_A$ is at NMOS 958A charges flying capacitor 955A, synchronous rectifier 959A is off and diode 960A is reverse biased. Meanwhile, while $V_B$ is at ground. NMOS 958B is off, diode 960B is forward biased and synchronous rectifier MOSFET 959B is conducting, transferring, charge from flying capacitor 958B to reservoir capacitor 965 and driving $(-V_{ee}) \rightarrow -V_{ee}$.

Alternatively when $V_B$ is at $V_{ee}$, NMOS 958B charges flying capacitor 954B, synchronous rectifier 959B is off and diode 960B is reverse biased. Meanwhile, while $V_A$ is at around, NMOS 958A is off, diode 960A is forward biased and synchronous rectifier MOSFET 959A is conducting, transferring charge from flying capacitor 955A to reservoir capacitor 965 and also driving $(-V_{ee}) \rightarrow -V_{ee}$.

Figure 19A:
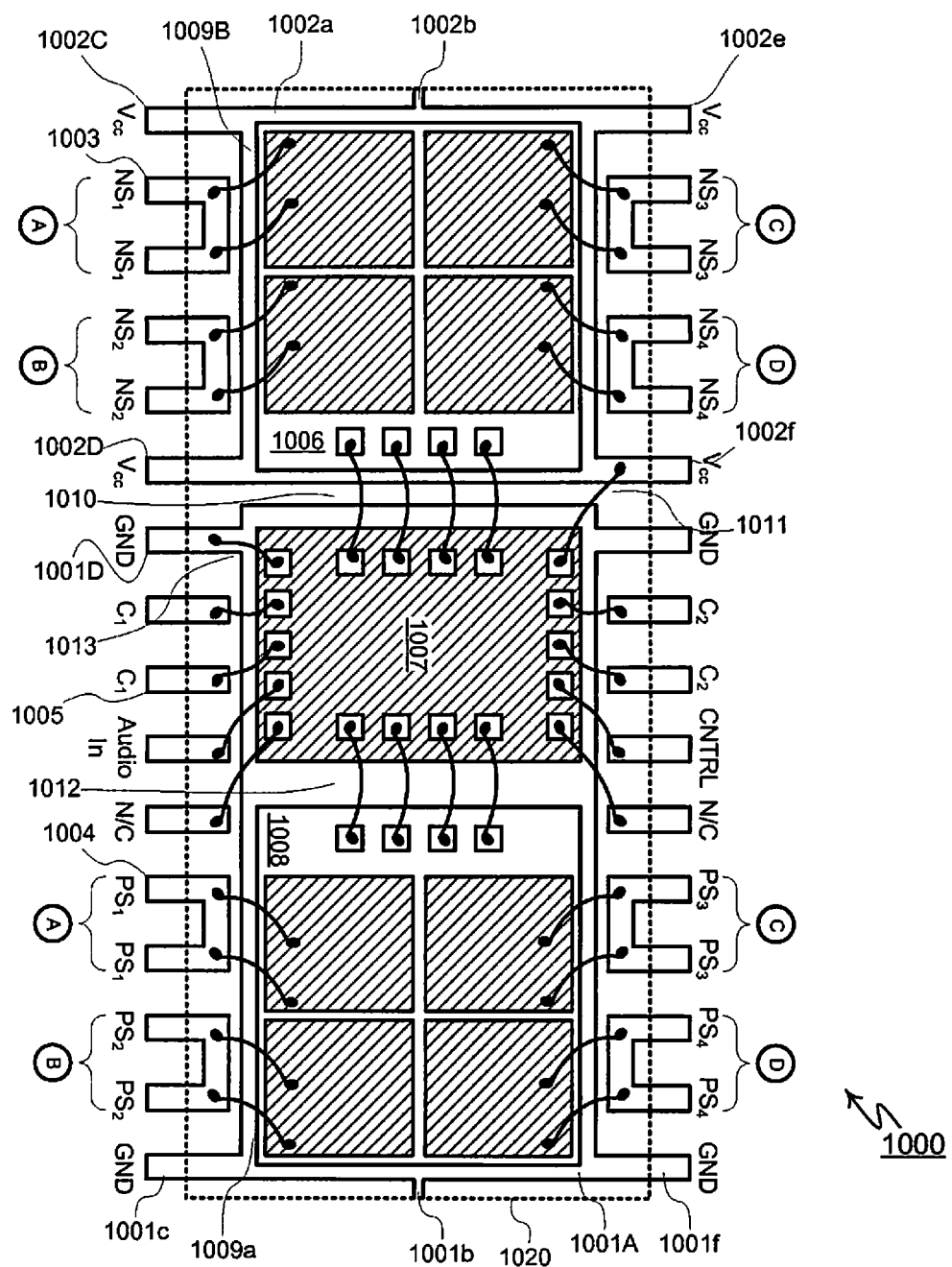

The positive bias supply $+V_{dd}$ in turn power gate buffers 962A and 962B while the negative bias supply $-V_{ee}$ powers buffers 961A and 961B. These buffers in turn drive a complementary follower half-bridge "A" comprising N-channel power MOSFET 951A and P-channel 952A and also drive half-bridge "B" comprising N-channel power MOSFET 951B and P-channel 952B, Multi-Channel Class-D Audio Implementation Using the aforementioned methods, integrating the H-bridge complementary-follower with bias generator and speaker drivers for class-D audio applications can be achieved in three silicon die which may be packaged separately or assembled into a single plastic package. FIG. 19A illustrates a plan view of lead-frame and triple-die assembly 1000 including controller IC 1007, quad P-channel vertical DMOS power MOSFET array 1008, and quad N-channel vertical DMOS power MOSFET array 1006.

Controller 1007 and power MOSFET dice 1008 share a common grounded die pad A with leads 1001C, 1001D, 1001E, 1001F and optional tie bar 1001B. The H-shaped copper die-pad offers superior thermal and electrical performance. Die attach of P-channel DMOS array 1008 is performed with TiNiAg sandwiched hack metal and conductive epoxy. On the top-side, vertical DMOS source regions are contacted using gold bond wires 1009A and connected to leads 1004, while chip-to-chip wire bonds 1012 are used to facilitate gate contact from controller 1007. The controller IC also includes individual bond wires to leads 1005, and down bond 1013 to facilitate top-side ground connection 1007.

A second $V_{ee}$-connected H-shaped die pad 1002A with leads 1002C, 1002D, 1002E, 1002F and optional tie bar 1002B is used support and contact N-channel high-side MOSFET array 1006 include source bonding wires 1009B to leads 1003, and die-to-die bonds 1010 for gate contact to controller 1007. Controller 1007 also includes down bond 1011 to $V_{ee}$-connected lead 1002F.

The entire triple-die assembly is housed in plastic mold compound 1020 and a 32 pin package. To electrically complete the amplifier, pins NS1 and PSI must be connected on the printed circuit board to form output A. Similarly pins NS2 and PS2 form output B, NS3 and PS3 for output C, and NS4 and PS4 form output D.

Figure 19B:
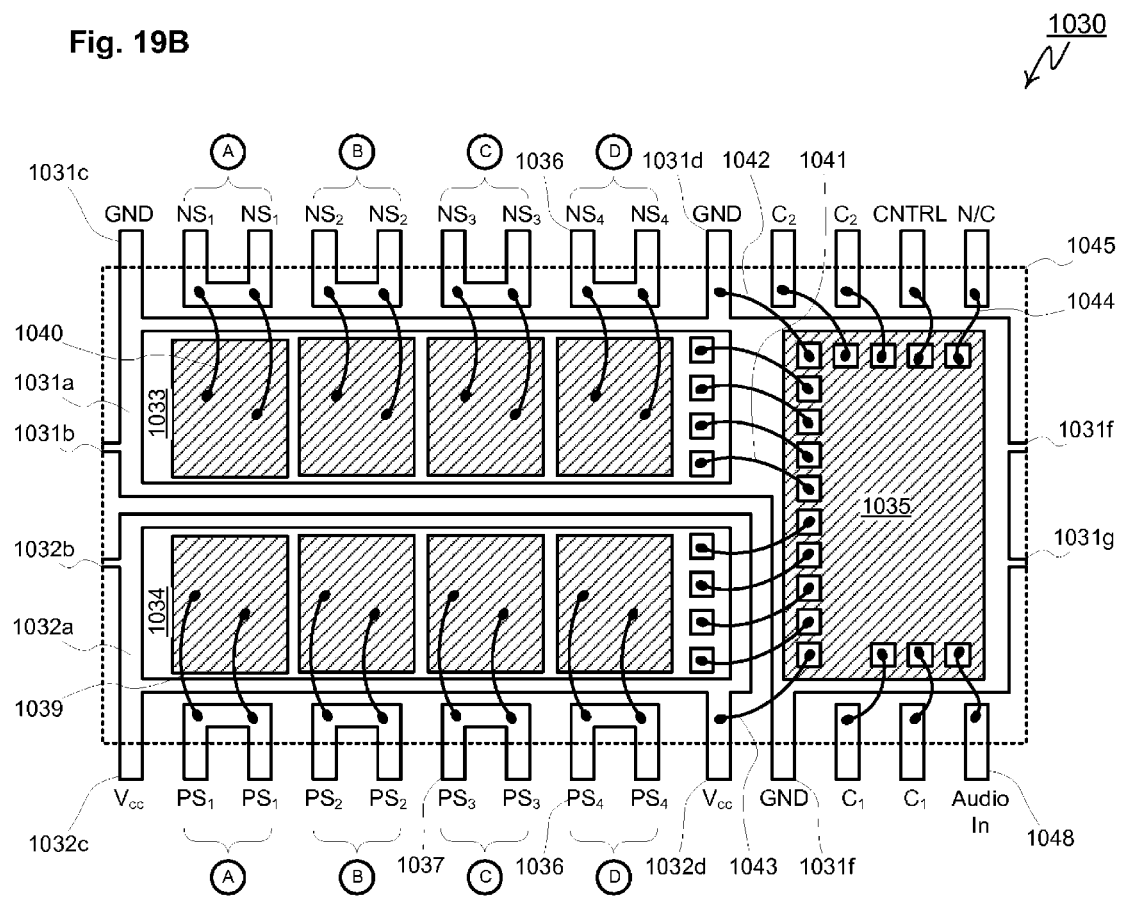

An alternate package solution 1030 shown in FIG. 19B utilizes an L-shaped grounded die pad 1031A with leads 1031C, 1031D and 1031E, and includes tie bars 1031B, 1031F, and 1031G. Controller IC 1035 includes wire bonds 1044 to individual pins 1048, down bond 1042, down bond 1043 to $V_{ee}$-connected pin 1032D and chip-to-chip bonds 1041 and 1043. Four P-channel DMOS array 1033 with backside metal is bonded to lead frame 1031A using a conductive silver-filled epoxy die attach and has source bond wires 1040 bonded to leads 1036.

N-channel DMOS array 1034 is mounted using conductive epoxy die attach to lead frame 1032A with leads 1032C and 1032D with tie bar 1032B. Top-side contact to DMOS source regions is facilitated using bond wires 1039 and leads 1037. The entire assembly is housed in plastic mold compound 1045 in a 28-pin package. Like assembly 1000 pins NS1 and PSI are connected on the printed circuit board to form output A, NS2 and PS2 to form output. B, etc. To eliminate the necessity of this printed circuit board connection, a stitch bond as shown in top view 1050 and cross section 1055 of FIGS. 19C and 19D may be used.

As shown a first multi-channel vertical DMOS die 1033 mounted on die pad 1031A and a second multi-channel vertical DMOS die 1034 mounted on a second die pad 1032A are connected to leads 1036 and 1037 by a stitch bond comprising segments 1051A, 1051B and 1051C and optionally by a second stitch bond comprising segments 1052A, 1052B and 1052C. The example illustrates the connection of NS2 and PS2 to form output B. A similar approach can be employed for other outputs. Plastic mold compound 1045 secures the entire assembly.

Figure 20:
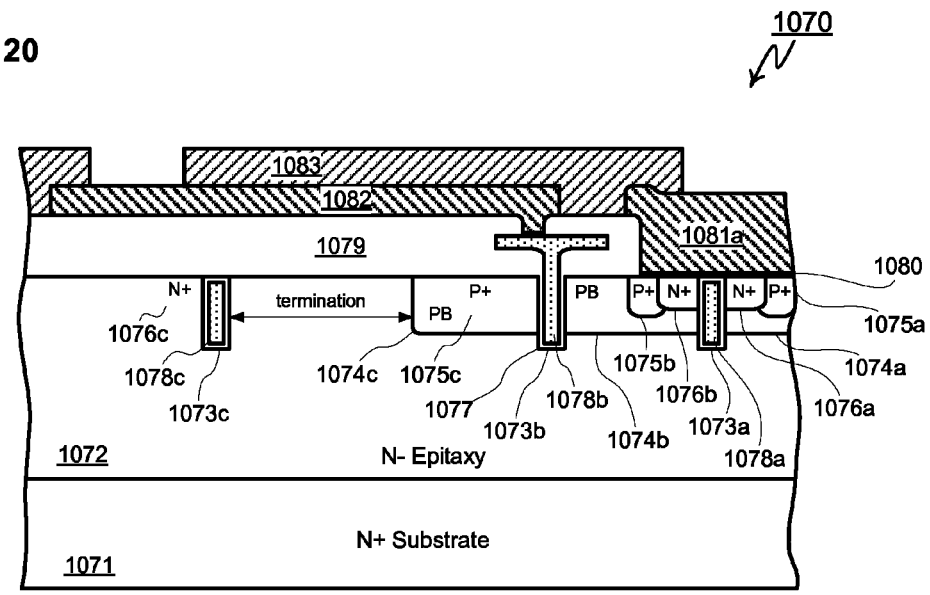
FIG. 20 is a cross section of a vertical trench DMOS illustrating gate interconnect re-routing for improved package layout.

Referring again to plan view 1000 of FIG. 19A, chip-to-chip bonding of vertical DMOS dice 1006 and 1008 require gate pads to be located on one edge of the MOSFET array. A similar requirement is shown in plan view 1030 containing common drain vertical MOSFETs 1033 and 1034. In order to relocate the gate pad to one edge of the die, the gate metal must cross over the high-voltage edge termination of the power MOSFET device. This technique is illustrated in vertical DMOS cross section 1070 of FIG. 20, were gate metal 1082 sitting atop thick dielectric 1079 crosses over a portion of drain epitaxial layer 1072 bounded by trench 1073C and N+ 1076C on one edge, and by PB body region 1074C and P+ 1075C on the other edge.

The gate metal contacts gate polysilicon 1078B through barrier metal 1080. Gate polysilicon 1078B, insulated from epitaxy 1071 by gate oxide 1077 lining trench 1073B also connects to active area trench polysilicon 1078A in trench 1073A. Provided dielectric 1079 is sufficiently thick, the breakdown of the vertical trench power MOSFET will not be adversely affected.

Figure 21:
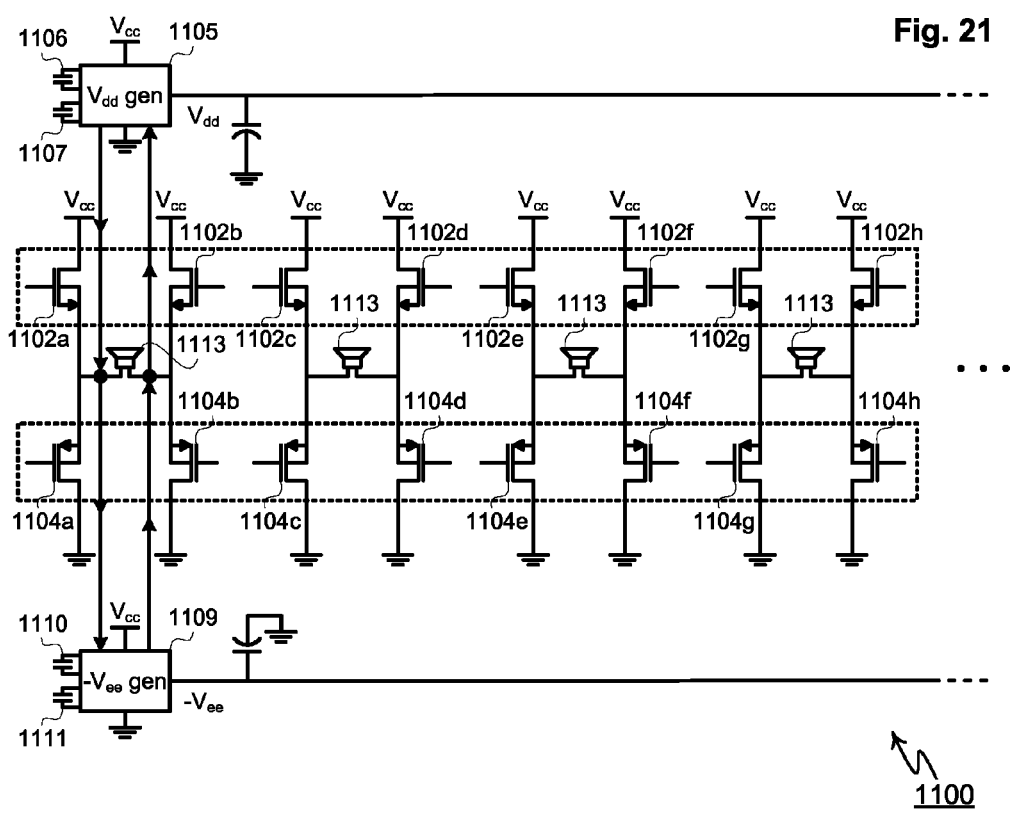
FIG. 21 is a schematic of a multi-channel class-D speaker configuration with complementary bootstrap bias generators.

As a complete multi-channel audio system, FIG. 21 illustrates a schematic of multi-channel class-D speaker configuration 1100 including $+V_{dd}$ and $-V_{ee}$ bias generators. The a positive bias generator 1105 powered by the H-bridge switching action driving speaker 1113 during class-D amplification, utilizes capacitors 1106, 1107 and filter capacitor 1108 to produce the $+V_{dd}$ bias supply. A negative bias generator 1109 also powered by the H-bridge switching action driving speaker 1113 during class-D amplification, utilizes capacitors 1110, 1111 and filter capacitor 1112 to produce the $-V_{ee}$ bias supply. The bias supplies in turn are used to power the gate buffers driving the other complementary follower H-bridges including DMOS 1102A, 1102B, 1104A and 1104B driving speaker 1113; DMOS 1102C, 1102D, 1104C and 1104D driving speaker 1114; DMOS 1102E, 1102F, 1104E and 1104F driving speaker 1115; and with DMOS 1102G, 1102H, 1104G and 1104H driving speaker 1116; all power from shared bias supplies 1105 and 1109.

I claim:

1. A stereo class-D audio system comprising:
    four NMOS high-side devices;
    four NMOS low-side devices; a source of each high-side device being connected to a drain of a respective low-side device to form four half-bridge circuits with the four half-bridge circuits grouped as two half-bridge pairs, each half-bridge circuit having an output node at the sourced of its high-side device and the drain of its low-side device;
    a package containing the two half-bridge pairs; and
    a set of electrical contacts for connecting the class-D audio system to an external circuit, the set of electrical contacts including at least one supply contact and at least one ground contact for each of the two half-bridge pairs, the supply contact of each half-bridge pair connected to the drains of the NMOS high-side devices within that half-bridge pair and the ground contact of each half-bridge pair connected to the sources of the NMOS low-side devices within that half-bridge pair, the electrical contacts also including at least one output contact for each output node of each half-bridge circuit.

2. The stereo Class D audio system of claim 1 further comprising four break-before-make buffers connected to the four half-bridge circuits, respectively.

3. The stereo Class D audio system of claim 2 wherein each of the four break-before-make buffers is connected to a gate of an NMOS high-side device and a gate of an NMOS low-side device within one of the four half-bridge circuits.

4. The stereo Class D audio system of claim 2 further comprising a stereo Class D audio system connected to each of the four break-before-make buffers.

5. The stereo Class D audio system of claim 1 wherein each of the four NMOS high-side devices and each of the four NMOS low-side devices is a vertical DMOS device.

6. The stereo Class D audio system of claim 5 wherein each of the NMOS low-side devices is a discrete device.

7. The stereo Class D audio system of claim 6 wherein all of the NMOS high-side devices share a single silicon chip.

8. The stereo Class D audio system of claim 6 wherein two of the NMOS high-side devices in a first half-bridge pair share a first silicon chip and two of the NMOS high-side devices in a second half-bridge pair share a second silicon chip.

9. The stereo Class D audio system of claim 5 wherein the drains of the four NMOS high-side devices are mounted to a single die pad.

10. The stereo Class D audio system of claim 9 wherein the drains of the four NMOS low-side devices are mounted to four separate die pads, respectively.

11. The stereo Class D audio system of claim 10 wherein the source of each of the four NMOS high-side devices is electrically connected by a bonding wire to one of the output contacts.

12. The stereo Class D audio system of claim 11 wherein each of the four separate die pads is electrically connected to one of the output contacts.

13. The stereo Class D audio system of claim 12 wherein the single die pad is electrically connected to the at least one supply contact.

14. The stereo Class D audio system of claim 13 wherein the source of each of the four NMOS low-side devices is electrically connected by a bonding wire to the at least one ground contact.

15. The stereo Class D audio system of claim 10 wherein the four separate die pads are mounted in a single row in the package.

16. The stereo Class D audio system of claim 10 wherein two of the separate die pads are mounted in the package on an opposite side of the single die pad from a remaining two of the separate die pads.

17. The stereo Class D audio system of claim 16 wherein the single die pad is H-shaped.

18. The stereo Class D audio system of claim 17 wherein the source of each of the four NMOS high-side devices is electrically connected by a bonding wire to one of the four separate die pads.

19. The stereo Class D audio system of claim 18 wherein each of the four separate die pads comprises one of the output contacts.

20. The stereo Class D audio system of claim 19 wherein the single die pad is electrically connected to the at least one supply contact.

21. The stereo Class D audio system of claim 20 wherein the source of each of the four NMOS low-side devices is electrically connected by a bonding wire to the at least one ground contact.

* * * * *

UNITED STATES PATENT AND TRADEMARK OFFICE
CERTIFICATE OF CORRECTION

| | | |
|---|---|---|
| PATENT NO. | : 8,593,220 B2 | Page 1 of 1 |
| APPLICATION NO. | : 13/788336 | |
| DATED | : November 26, 2013 | |
| INVENTOR(S) | : Richard K. Williams | |

It is certified that error appears in the above-identified patent and that said Letters Patent is hereby corrected as shown below:

In the Claims:

Claim 1, column 33, line 31, delete "haying" and insert --having--.

Claim 1, column 33, line 32, delete "sourced" and insert --source--.

Signed and Sealed this
Seventeenth Day of June, 2014

Michelle K. Lee
*Deputy Director of the United States Patent and Trademark Office*